United States Patent
Bradshaw et al.

(10) Patent No.: US 10,838,831 B2
(45) Date of Patent: Nov. 17, 2020

(54) DIE-SCOPE PROXIMITY DISTURB AND DEFECT REMAPPING SCHEME FOR NON-VOLATILE MEMORY

(71) Applicant: Micron Technology, Inc., Boise, ID (US)

(72) Inventors: Samuel E. Bradshaw, Sacramento, CA (US); Justin Eno, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 267 days.

(21) Appl. No.: 15/979,252

(22) Filed: May 14, 2018

(65) Prior Publication Data

US 2019/0347170 A1    Nov. 14, 2019

(51) Int. Cl.
  G06F 11/00    (2006.01)
  G06F 11/16    (2006.01)
  G06F 11/18    (2006.01)
  G06F 3/06     (2006.01)

(52) U.S. Cl.
  CPC ........ *G06F 11/1666* (2013.01); *G06F 3/0619* (2013.01); *G06F 3/0631* (2013.01); *G06F 3/0644* (2013.01); *G06F 3/0688* (2013.01); *G06F 11/18* (2013.01)

(58) Field of Classification Search
  CPC .............. G11C 11/5268; G11C 11/106; G11C 16/3427; G11C 16/3422; G11C 16/3431; G11C 13/004; G11C 13/0064; G11C 13/003; G11C 2211/5641
  See application file for complete search history.

(56) References Cited

U.S. PATENT DOCUMENTS

| | | | |
|---|---|---|---|
| 7,379,316 B2 * | 5/2008 | Rajan ................. | G11C 5/02 |
| | | | 365/63 |
| 9,432,298 B1 * | 8/2016 | Smith ................ | H04L 49/9057 |
| 10,445,195 B2 | 10/2019 | Bradshaw et al. | |

(Continued)

OTHER PUBLICATIONS

Notice of Allowance, U.S. Appl. No. 15/979,308, dated Jan. 28, 2020, 10 pages.

*Primary Examiner* — Bryce P Bonzo
*Assistant Examiner* — Jeison C Arcos
(74) *Attorney, Agent, or Firm* — Nicholson De Vos Webster & Elliott LLP

(57) ABSTRACT

Techniques for remapping portions of an array of non-volatile memory (NVM) resident on a die, in which the die is one of a plurality of NVM dice forming a memory device. A processing device partitions the NVM into a plurality of subslice elements comprising respective physical portions of non-volatile memory having proximal disturb relationships. The NVM has a first portion of the subslice elements allocated as user subslice elements and a second portion as spare subslice elements and the processing device performs an error analysis to identify a predetermined number of subslice elements having highest error rates for a memory domain on the die. For the identified subslice elements having the highest error rates, the processing device remaps user subslice elements to spare subslice elements that were not identified as having the highest error rates to remove subslice element or elements having highest error rates from a user space of the NVM.

24 Claims, 16 Drawing Sheets

(56) References Cited

U.S. PATENT DOCUMENTS

| | | | | |
|---|---|---|---|---|
| 2002/0091965 A1* | 7/2002 | Moshayedi | G06F 11/004 | 714/6.13 |
| 2003/0033561 A1* | 2/2003 | Oonk | G11C 29/56 | 714/42 |
| 2004/0076057 A1* | 4/2004 | Goebel | G11C 11/22 | 365/202 |
| 2004/0093472 A1* | 5/2004 | Dahlen | G06F 11/2061 | 711/158 |
| 2004/0196707 A1* | 10/2004 | Yoon | G06F 12/0246 | 365/200 |
| 2006/0248529 A1* | 11/2006 | Loboz | G06F 11/3423 | 718/100 |
| 2007/0180186 A1* | 8/2007 | Cornwell | G06F 12/023 | 711/103 |
| 2008/0013380 A1* | 1/2008 | Cornwell | G11C 11/5642 | 365/185.21 |
| 2008/0198644 A1* | 8/2008 | Broms | B82Y 10/00 | 365/145 |
| 2009/0164710 A1* | 6/2009 | Choi | G11C 16/10 | 711/103 |
| 2009/0225598 A1* | 9/2009 | Han | G06F 11/1068 | 365/185.09 |
| 2010/0122148 A1* | 5/2010 | Flynn | G06F 11/108 | 714/773 |
| 2010/0172179 A1* | 7/2010 | Gorobets | G06F 12/0246 | 365/185.09 |
| 2010/0241929 A1* | 9/2010 | Song | G06F 11/1072 | 714/763 |
| 2011/0090004 A1* | 4/2011 | Schuetz | G11C 29/808 | 327/564 |
| 2012/0226963 A1* | 9/2012 | Bivens | G11C 29/42 | 714/773 |
| 2014/0237298 A1* | 8/2014 | Pe'er | G11C 16/3418 | 714/42 |
| 2016/0172029 A1 | 6/2016 | Kern et al. | | |
| 2016/0180952 A1* | 6/2016 | Darragh | G11C 16/32 | 365/185.09 |
| 2016/0363626 A1* | 12/2016 | How | G06F 11/1625 | |
| 2017/0147217 A1* | 5/2017 | Chang | G06F 3/0679 | |
| 2018/0285007 A1* | 10/2018 | Franklin | G06F 3/0625 | |
| 2018/0285187 A1* | 10/2018 | Eno | G06F 11/108 | |
| 2019/0205225 A1* | 7/2019 | Kim | G06F 3/061 | |
| 2019/0206477 A1* | 7/2019 | Kim | G11C 29/04 | |
| 2019/0347150 A1 | 11/2019 | Bradshaw et al. | | |
| 2019/0347151 A1* | 11/2019 | Eno | G06F 3/0634 | |
| 2019/0348146 A1 | 11/2019 | Bradshaw et al. | | |
| 2020/0004629 A1* | 1/2020 | Zamir | G06F 3/0673 | |

\* cited by examiner

| Subslice | Partition | | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| 0 | 0 | 0 | 1 | 2 | 3 | 4 | 5 | 6 | 7 | 8 | 9 | 10 | 11 | 12 | 13 | 14 | 15 |
| 0 | 1 | 16 | 17 | 18 | 19 | 20 | 21 | 22 | 23 | 24 | 25 | 26 | 27 | 28 | 29 | 30 | 31 |
| 0 | 2 | 32 | 33 | 34 | 35 | 36 | 37 | 38 | 39 | 40 | 41 | 42 | 43 | 44 | 45 | 46 | 47 |
| 0 | 3 | 48 | 49 | 50 | 51 | 52 | 53 | 54 | 55 | 56 | 57 | 58 | 59 | 60 | 61 | 62 | 63 |
| 1 | 4 | 64 | 65 | 66 | 67 | 68 | 69 | 70 | 71 | 72 | 73 | 74 | 75 | 76 | 77 | 78 | 79 |
| 1 | 5 | 80 | 81 | 82 | 83 | 84 | 85 | 86 | 87 | 88 | 89 | 90 | 91 | 92 | 93 | 94 | 95 |
| 1 | 6 | 96 | 97 | 98 | 99 | 100 | 101 | 102 | 103 | 104 | 105 | 106 | 107 | 108 | 109 | 110 | 111 |
| 1 | 7 | 112 | 113 | 114 | 115 | 116 | 117 | 118 | 119 | 120 | 121 | 122 | 123 | 124 | 125 | 126 | 127 |
| 2 | 8 | 128 | 129 | 130 | 131 | 132 | 133 | 134 | 135 | 136 | 137 | 138 | 139 | 140 | 141 | 142 | 143 |
| 2 | 9 | 144 | 145 | 146 | 147 | 148 | 149 | 150 | 151 | 152 | 153 | 154 | 155 | 156 | 157 | 158 | 159 |
| 2 | 10 | 160 | 161 | 162 | 163 | 164 | 165 | 166 | 167 | 168 | 169 | 170 | 171 | 172 | 173 | 174 | 175 |
| 2 | 11 | 176 | 177 | 178 | 179 | 180 | 181 | 182 | 183 | 184 | 185 | 186 | 187 | 188 | 189 | 190 | 191 |
| 3 | 12 | 192 | 193 | 194 | 195 | 196 | 197 | 198 | 199 | 200 | 201 | 202 | 203 | 204 | 205 | 206 | 207 |
| 3 | 13 | 208 | 209 | 210 | 211 | 212 | 213 | 214 | 215 | 216 | 217 | 218 | 219 | 220 | 221 | 222 | 223 |
| 3 | 14 | 224 | 225 | 226 | 227 | 228 | 229 | 230 | 231 | 232 | 233 | 234 | 235 | 236 | 237 | 238 | 239 |
| 3 | 15 | 240 | 241 | 242 | 243 | 244 | 245 | 246 | 247 | 248 | 249 | 250 | 251 | 252 | 253 | 254 | 255 |

FIG. 6

| Channel | | | | | | | |
|---|---|---|---|---|---|---|---|
| Die 0 | Die 1 | Die 2 | Die 3 | Die 4 | Die 5 | Die 6 | Die 7 |
| 0 | 34 | 2 | 240 | 0 | 13 | 11 | 13 |
| 17 | 51 | 18 | 241 | 16 | 19 | 21 | 17 |
| 34 | 77 | 34 | 242 | 32 | 29 | 37 | 21 |
| 35 | 79 | 50 | 243 | 48 | 30 | 51 | 35 |
| 36 | 103 | 66 | 244 | 64 | 33 | 53 | 96 |
| 37 | 109 | 82 | 245 | 80 | 78 | 84 | 107 |
| 59 | 125 | 98 | 246 | 96 | 88 | 87 | 108 |
| 72 | 180 | 114 | 247 | 112 | 91 | 90 | 130 |
| 79 | 183 | 130 | 248 | 128 | 96 | 92 | 202 |
| 112 | 199 | 146 | 249 | 144 | 103 | 97 | 212 |
| 179 | 200 | 162 | 250 | 160 | 122 | 104 | 254 |
| 201 | 233 | 178 | 251 | 176 | 180 | 137 | 255 |
| 202 | 234 | 194 | 252 | 192 | 182 | 156 | |
| 250 | 235 | 210 | 253 | 208 | 188 | 188 | |
| 252 | 250 | 226 | 254 | 224 | 199 | 198 | |
| 254 | 251 | 242 | 255 | 240 | 204 | 205 | |
| | | | | | | 208 | |
| | | | | | | 222 | |
| | | | | | | 223 | |
| | | | | | | 245 | |

Initial Highest Error Rate (RBER) Subslice Elements
With Initially Designated Spare Subslice Elements indicated in Boxes

FIG. 12

Dice Subslice Substitution Data Structure (Tables) — 140

| Die 0 Offset | Table Value |
|---|---|
| 0 | 0,0 |
| 1 | 0,17 |
| 2 | 0,34 |
| 3 | 0,35 |
| 4 | 0,36 |
| 5 | 0,37 |
| 6 | 0,112 |
| 7 | 0,179 |
| 8 | 0,72 |
| 9 | 0,201 |
| 10 | 0,250 |
| 11 | 0,59 |
| 12 | 0,252 |
| 13 | 0,202 |
| 14 | 0,254 |
| 15 | 0,79 |

| Die 1 Offset | Table Value |
|---|---|
| 0 | 1,109 |
| 1 | 1,125 |
| 2 | 1,34 |
| 3 | 1,51 |
| 4 | 1,180 |
| 5 | 1,183 |
| 6 | 1,199 |
| 7 | 1,103 |
| 8 | 1,200 |
| 9 | 1,233 |
| 10 | 1,250 |
| 11 | 1,251 |
| 12 | 1,234 |
| 13 | 1,77 |
| 14 | 1,235 |
| 15 | 1,79 |

| Die 2 Offset | Table Value |
|---|---|
| 0 | 2,2 |
| 1 | 2,18 |
| 2 | 2,242 |
| 3 | 2,34 |
| 4 | 2,50 |
| 5 | 2,66 |
| 6 | 2,82 |
| 7 | 2,98 |
| 8 | 2,114 |
| 9 | 2,130 |
| 10 | 2,146 |
| 11 | 2,162 |
| 12 | 2,178 |
| 13 | 2,194 |
| 14 | 2,210 |
| 15 | 2,226 |

| Die 3 Offset | Table Value |
|---|---|
| 0 | 3,240 |
| 1 | 3,241 |
| 2 | 3,242 |
| 3 | 3,243 |
| 4 | 3,244 |
| 5 | 3,245 |
| 6 | 3,246 |
| 7 | 3,247 |
| 8 | 3,248 |
| 9 | 3,249 |
| 10 | 3,250 |
| 11 | 3,251 |
| 12 | 3,252 |
| 13 | 3,253 |
| 14 | 3,254 |
| 15 | 3,255 |

| Die 4 Offset | Table Value |
|---|---|
| 0 | 4,240 |
| 1 | 4,0 |
| 2 | 4,16 |
| 3 | 4,32 |
| 4 | 4,48 |
| 5 | 4,64 |
| 6 | 4,80 |
| 7 | 4,96 |
| 8 | 4,112 |
| 9 | 4,128 |
| 10 | 4,144 |
| 11 | 4,160 |
| 12 | 4,176 |
| 13 | 4,192 |
| 14 | 4,208 |
| 15 | 4,224 |

| Die 5 Offset | Table Value |
|---|---|
| 0 | 5,96 |
| 1 | 5,33 |
| 2 | 5,29 |
| 3 | 5,19 |
| 4 | 5,180 |
| 5 | 5,78 |
| 6 | 5,182 |
| 7 | 5,103 |
| 8 | 5,88 |
| 9 | 5,199 |
| 10 | 5,122 |
| 11 | 5,91 |
| 12 | 5,188 |
| 13 | 5,13 |
| 14 | 5,30 |
| 15 | 5,204 |

| Die 6 Offset | Table Value |
|---|---|
| 0 | 6,208 |
| 1 | 6,97 |
| 2 | 6,21 |
| 3 | 6,51 |
| 4 | 6,84 |
| 5 | 6,245 |
| 6 | 6,198 |
| 7 | 6,87 |
| 8 | 6,104 |
| 9 | 6,137 |
| 10 | 6,90 |
| 11 | 6,11 |
| 12 | 6,92 |
| 13 | 6,205 |
| 14 | 6,222 |
| 15 | 6,223 |

| Die 7 Offset | Table Value |
|---|---|
| 0 | 7,96 |
| 1 | 7,17 |
| 2 | 7,130 |
| 3 | 7,35 |
| 4 | 7,212 |
| 5 | 7,21 |
| 6 | 6,37 |
| 7 | 6,53 |
| 8 | 6,156 |
| 9 | 6,188 |
| 10 | 7,202 |
| 11 | 7,107 |
| 12 | 7,108 |
| 13 | 7,13 |
| 14 | 7,254 |
| 15 | 7,255 |

FIG. 15

DIE-SCOPE PROXIMITY DISTURB AND DEFECT REMAPPING SCHEME FOR NON-VOLATILE MEMORY

FIELD OF THE DISCLOSURE

The various embodiments described in this disclosure relate to non-volatile memory. In particular, embodiments pertain to die-scope proximity disturb and defect remapping scheme for non-volatile memory.

BACKGROUND OF THE DISCLOSURE

In the field of non-volatile media (NVM), as storage elements are forced closer and closer together to achieve smaller products, the storage elements have reduced physical isolation. This reduction in physical isolation, as well as natural variations that arise from a complex manufacturing process, result in a variety of defects, such as storage elements with high read and/or write error rates. For media that use a thermal process to encode the state of the storage element, such as phase change media, thermal effects propagate to surrounding storage elements. This document refers to these propagated thermal effects as disturb coupling. Disturb coupling may result in a change in the state of the surrounding storage elements (victim elements). This may be mitigated at the cost of greater thermal isolation through choices of substrate, greater physical segregation, or by concurrent programming of the coupled elements. Each approach, however, has some limitations in the cost, complexity, and/or performance. As such, complementary to NVM design choices to eliminate or reduce disturb coupling, it is advantageous to actively manage coupling and its effects.

Defect remapping schemes may implement re-vectoring schemes, wherein a logical address associated with a defective physical region is directed to a different physical region. Exchanging one set of neighbors for another results in a different set of proximity disturb relationships for the new physical region. For example, a managed unit of a memory may comprise a number of write units, pages, or other portion of memory laid out in a certain physical address order for a die. Remapping a portion of a managed unit could add a set of new neighbors to the existing set of disturb neighbors, increasing the complexity of identifying neighbors and the cost of remediation for the now expanded set of neighbor units.

BRIEF DESCRIPTION OF THE DRAWINGS

The disclosure is illustrated by way of example and not limitation in the figures of the accompanying drawings, in which like references indicate similar elements, and in which:

FIG. 6 is a diagram illustrating a partitioning of respective subslices of FIG. 5 into partitions of FIG. 4 to form an array of individual subslice elements, along with a subslice element numbering convention according to one embodiment;

FIG. 12 illustrates an example diagram showing subslice elements having highest error rates where a memory domain is across eight dice of a channel according to one embodiment;

FIG. 15 illustrates entries for a subslice substitution data structure for the eight dice after completion of remapping of subslice elements having highest error rates shown in FIG. 12 according to one embodiment;

DETAILED DESCRIPTION

This disclosure describes embodiments that allow for remapping of defective or low performing storage elements, while attempting to minimize the introduction of new proximal disturb relationships when performing the remapping to spare storage locations. Storage elements (or memory elements) are storage locations (e.g., memory cells) that can be programmed to a target state or states. The storage elements can be part of a memory device of a memory system. An example of a memory system is a storage system, such as a solid-state drive (SSD). In some embodiments, the memory system is a hybrid memory/storage system. In general, a host system can utilize a memory system that includes media, such as one or more memory devices. The memory devices can include non-volatile memory devices (NVM). The host system can provide write requests to store data at the memory devices of the memory system and can provide read requests to retrieve data stored at the memory system.

Defects pertaining to storage elements may include manufacturing/physical anomalies that prevent reliable data storage and/or retrieval, as well as structural weaknesses in media that manifest in a variety of observable ways. For example, structural weaknesses may manifest in lower endurance (cycling). Defects may also include low performing storage elements, which are still usable, but have undesirable high error rates in reading or writing data. In one instance, proximal disturb is a manipulation (e.g., read, write, erase, etc.) of one storage element (e.g., a cell) or group of storage elements that physically affects one or more neighboring elements in an undesirable way. If left unmanaged, the data stored in the neighboring storage elements may become unreliable after a sufficient number of disturbs.

Figure 1:
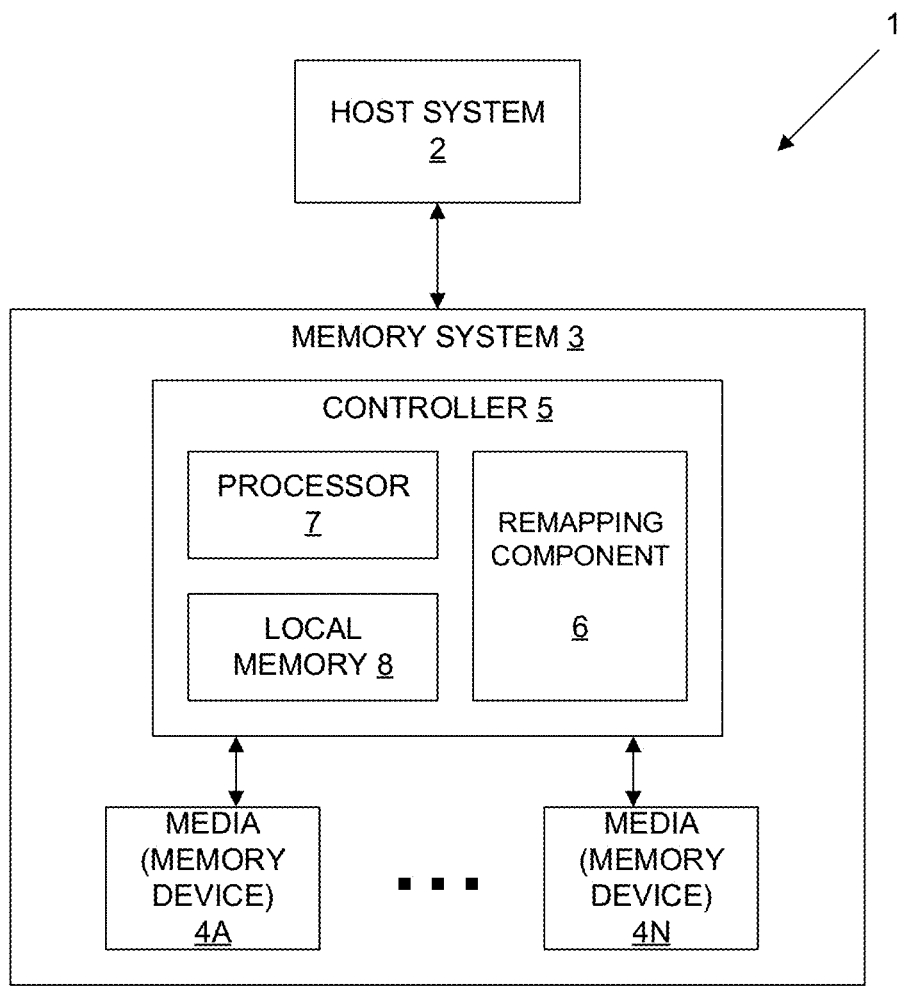
FIG. 1 illustrates an example computing environment that includes a memory system.
Figure 2:
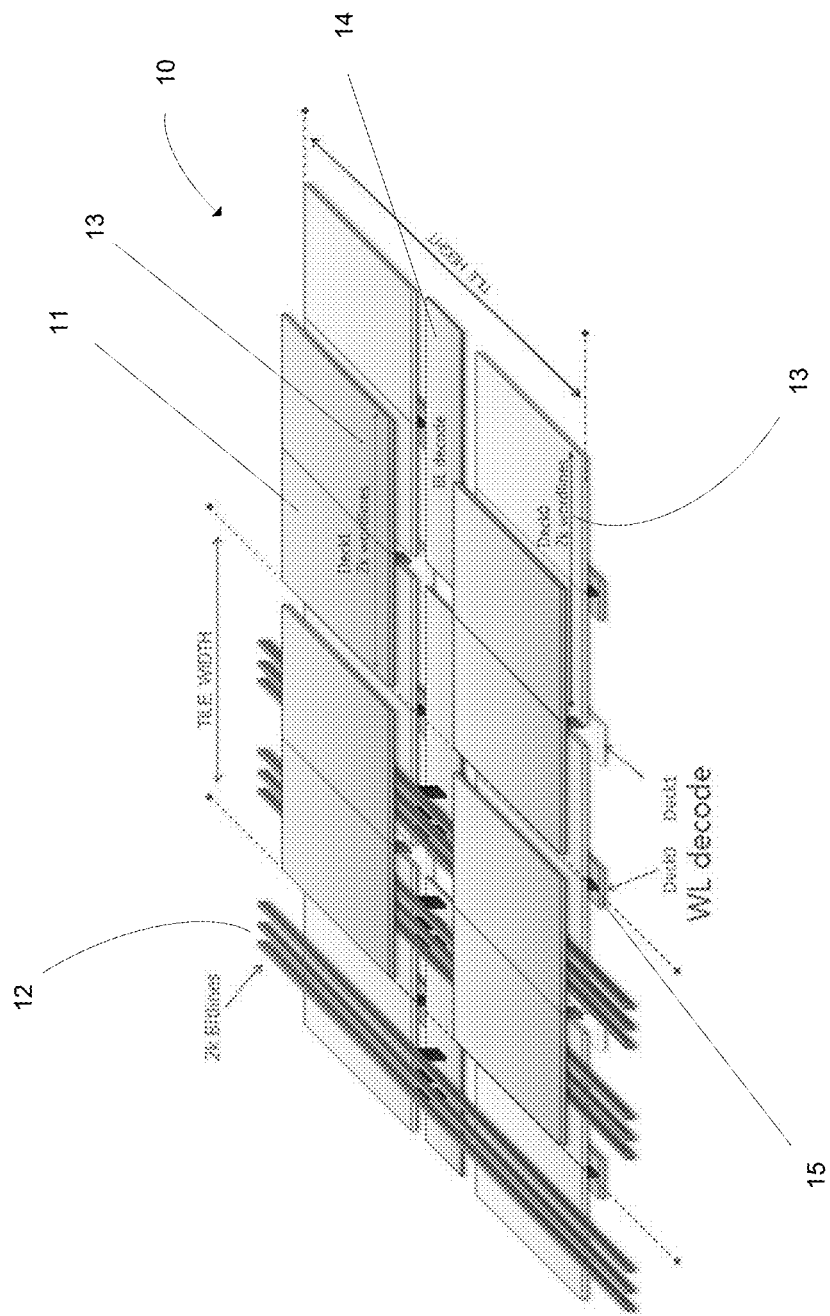
FIG. 2 illustrates an example portion of a structure of an array of non-volatile memory for performing a remapping according to one embodiment.
Figure 8:
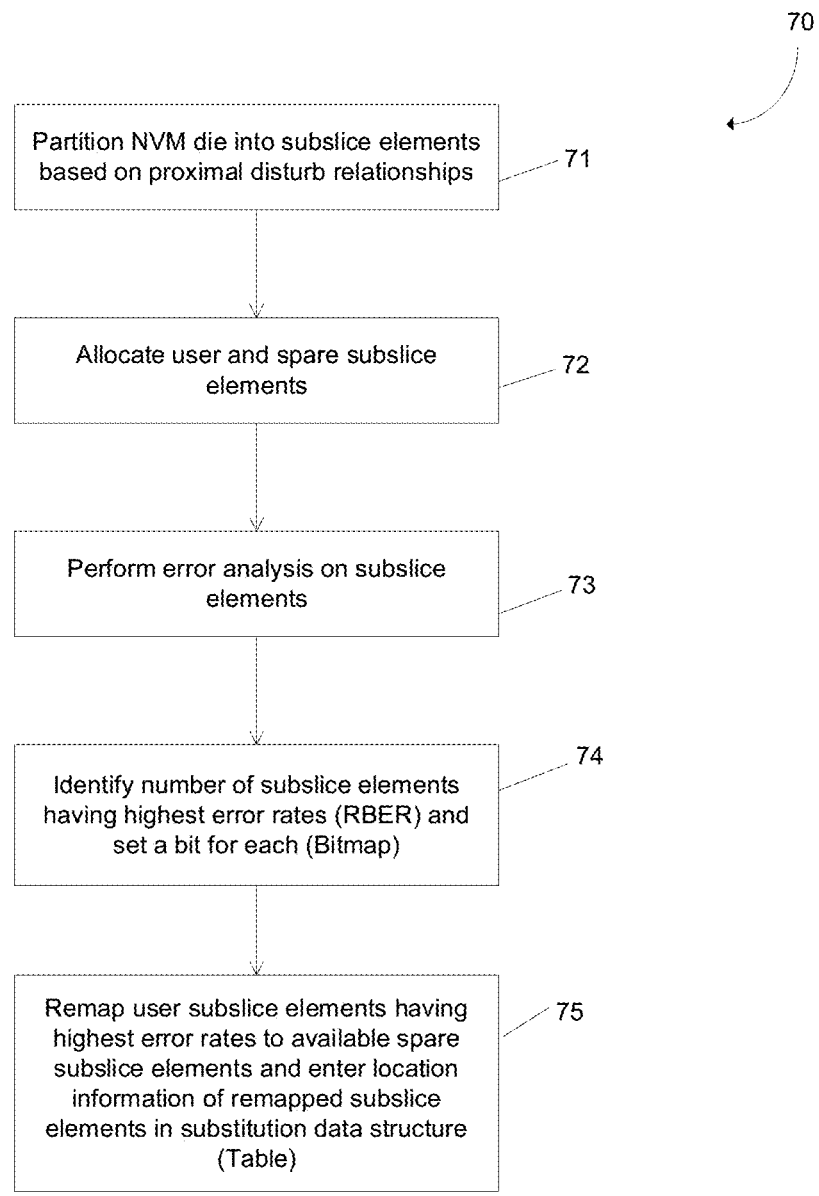
FIG. 8 illustrates a flow chart of a method to perform remapping of a non-volatile memory die where a memory domain for the remapping is limited to a die or a portion of a die according to one embodiment.
Figure 11:
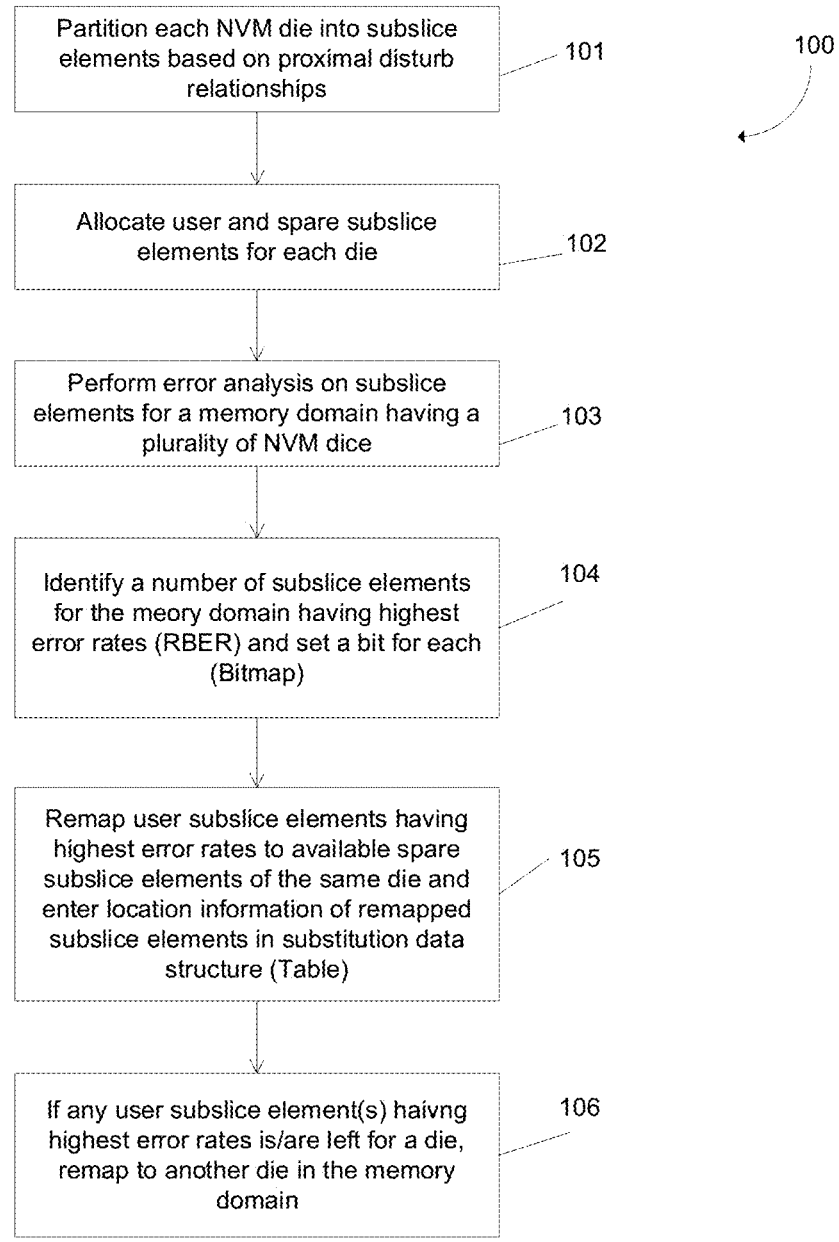
FIG. 11 illustrates a flow chart for a method to perform remapping of a non-volatile memory die where a memory domain for the remapping encompasses a plurality of dice.
Figure 17:
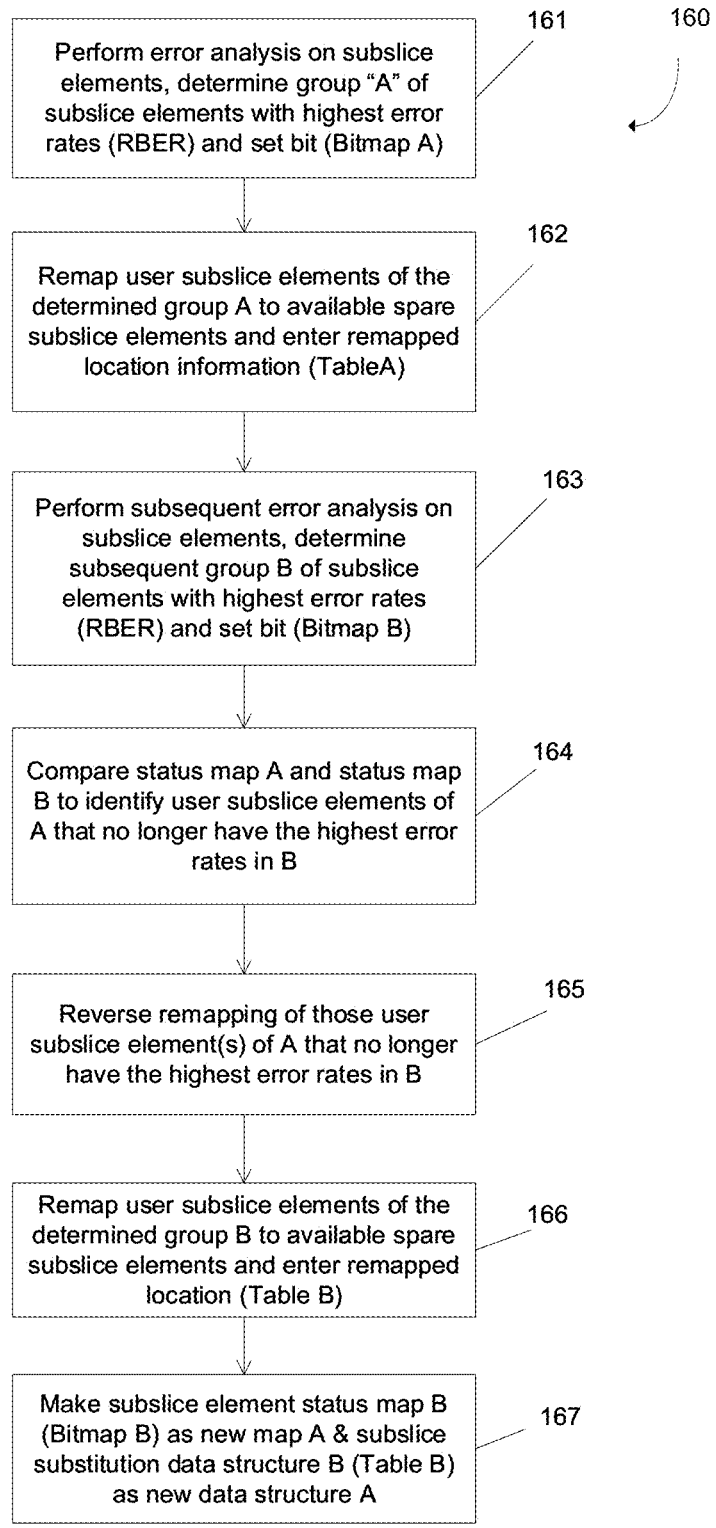
FIG. 17 illustrates a flow chart of a method to use a pair of subslice element status maps and a pair of subslice substitution data structures to continue updating those subslice elements with highest error rates over time.

The technique(s) of remapping may be applied to a variety of non-volatile memory devices (e.g. NAND memory devices). In some instances, memory devices can be referred to as media. FIG. 1 shows an apparatus that includes a memory system for performing the various described methods and techniques to remap storage elements, while minimizing the introduction of new disturb relationships, as well as the reversal of the remapping, in accordance with various embodiments of the present disclosure. FIG. 2 illustrates one example of an array of non-volatile memory (NVM) addressed by embodiments set forth herein. FIG. 8 shows one method for remapping storage elements, where the remapping confines the memory domain to a single die of a plurality of dice or to a portion of a die, in accordance with various embodiments of the present disclosure. FIG. 11 shows another method when remapping expands the memory domain to a plurality of dice, in accordance with various embodiments of the present disclosure. FIG. 17 shows a method for performing forward translation to remap a defective or low performing storage element to a spare storage location, and reversing the remapping with a reverse translation when that storage element is subsequently no longer defective or low performing, in accordance with various embodiments of the present disclosure.

FIG. 1 illustrates an example computing environment 1 that includes a memory system 3 in accordance with some implementations of the present disclosure. The memory system 3 can include media, such as memory devices 4A to 4N. The memory devices 4A to 4N can be volatile memory devices, non-volatile memory devices, or a combination of such. In some embodiments, the memory system is a storage system. An example of a storage system is a SSD. In general, the computing environment 1 can include a host system 2 that uses the memory system 3. In some implementations, the host system 2 can write data to the memory system 3 and read data from the memory system 3. In some embodiments, the memory system 3 is a hybrid memory/storage system.

The host system 2 can be a computing device such as a desktop computer, laptop computer, network server, mobile device, or such computing device that includes a memory and a processing device. The host system 2 can include or be coupled to the memory system 3 so that the host system 2 can read data from or write data to the memory system 3. The host system 2 can be coupled to the memory system 3 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel (FC), Serial Attached SCSI (SAS), etc. The physical host interface can be used to transmit data between the host system 2 and the memory system 3. The host system 2 can further utilize an NVM Express (NVMe) interface to access the memory devices 4A to 4N when the memory system 3 is coupled with the host system 2 by the PCIe interface. The physical host interface can provide an interface for passing control, address, data, and other signals between the memory system 3 and the host system 2. Furthermore, in some embodiments, such as a system on a chip (SoC), the host system 2 may be part of a system that is included within computing environment 1.

The memory devices 4A to 4N can include any combination of the different types of non-volatile memory devices and/or volatile memory devices. An example of non-volatile memory devices includes a negative-and (NAND) type flash memory. Each of the memory devices 4A to 4N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 2. Although non-volatile memory devices such as NAND type flash memory are described, the memory devices 4A to 4N can be based on any other type of memory such as a volatile memory. In some implementations, the memory devices 4A to 4N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 4A to 4N can be grouped as memory pages or data blocks that can refer to a unit of the memory device used to store data.

In one embodiment, PCM technology that changes the bulk resistance of the material constructs an array of non-volatile storage elements of memory devices 4A to 4N, including an array that is three-dimensional (3D). In one embodiment, chalcogenide glass provides the material to construct the storage elements, as well as the corresponding selectors. The plurality of dice forming the memory devices 4A to 4N may be arranged in various ways. In one embodiment, the dice 1 through n (where "n" is an integer) of memory devices 4A to 4N may represent the dice of the various described embodiments of this disclosure. The memory system controller 5 couples to memory devices 4A to 4N via access lines, such as bitlines, wordlines, control lines, to access the memory devices 4A to 4N to perform various operations, such as read, write, erase, etc.

The number of dice forming memory devices 4A to 4N varies depending on how much memory is desirable or designed for a system. For example, applying the structure of memory 10 illustrated in FIG. 2, 128 dice provide 2 terabytes of storage, while 256 dice provide 4 terabytes. Other combinations are possible.

The controller 5 can communicate with the memory devices 4A to 4N to perform operations such as reading data, writing data, or erasing data at the memory devices 4A to 4N and other such operations. The controller 5 can include hardware such as one or more integrated circuits and/or discrete components, a buffer memory, or a combination thereof. The controller 5 can be a microcontroller, special purpose logic circuitry (e.g., a field programmable gate array (FPGA), an application specific integrated circuit (ASIC), etc.), or other suitable processor.

In general, the controller 5 can receive commands or operations from the host system 2 and can convert the commands or operations into instructions or appropriate commands to achieve the desired access to the memory devices 4A to 4N. The controller 5 can be responsible for other operations such as wear leveling operations, garbage collection operations, error detection and error-correcting code (ECC) operations, encryption operations, caching operations, and address translations between a logical block address and a physical block address that are associated with the memory devices 4A to 4N. The controller 5 can further include host interface circuitry to communicate with the host system 2 via the physical host interface. The host interface circuitry can convert the commands received from the host system into command instructions to access the memory devices 4A to 4N as well as convert responses associated with the memory devices 4A to 4N into information for the host system 2.

The memory system 3 can also include additional circuitry or components that are not illustrated. In some implementations, the memory system 3 can include SRAM memory, a cache or buffer (e.g., DRAM), and address circuitry (e.g., a row decoder and a column decoder) that can receive an address from the controller 5 and decode the address to access the memory devices 4A to 4N.

When the controller 5 creates various tables and bitmaps, additional circuitry or components (e.g., SRAM memory) stores these items. Thus, additional circuitry or components may store subslice element status map A, subslice element status map B, subslice substitution data structure A, and subslice substitution data structure B, which are described in greater detail below in conjunction with FIG. 8 and FIG. 9. In one embodiment, for a memory domain confined to a single die, a SRAM memory allocates 4 K bytes for the bitmaps of subslice element status maps and 2 K bytes for the tables of subslice substitution data structures for a 128-dice memory 186. For a 256-dice memory, the allocation is 8K bytes for the bitmaps and 4 k bytes for the Tables. For the 8-dice memory domain, the SRAM memory allocation is 16K bytes for the bitmaps and 2.75K bytes for the Tables for a 128-dice memory 186. The SRAM allocation for a 256-dice memory 186 is 40K bytes for the bitmaps and 6K bytes for the tables. These allocations are examples only and other embodiments may have different allocations. Thus, memory system 3 may perform the various methods and techniques described above.

The memory system 3 can include a remapping component 6 to remap units of non-volatile memory to spare locations, while maintaining substantially the same proximal disturb relationships for the portions being remapped. In some embodiments, the remapping component 6 is part of the controller 5. The controller 5 can include a processor (processing device) 7 configured to execute instructions stored in local memory 8. In the illustrated example, the local memory 8 of the controller 5 includes an embedded memory configured to store instructions for performing various processes, operations, logic flows, and routines that control operation of the memory system 3, including handling communications between the memory system 3 and the host system 2. In some embodiments, the local memory 8 can include memory registers storing, e.g., memory pointers, fetched data, etc. The local memory 8 can also include read-only memory (ROM) for storing micro-code. While the example memory system 3 in FIG. 1 has been illustrated as including the controller 5, in another embodiment of the present disclosure, a memory system 3 may not include a controller 5, and may instead rely upon external control (e.g., provided by an external host, or by a processor or controller separate from the memory system).

Processor 7 and associated firmware/software may be separate units or incorporated together as a unit. Furthermore, processor 7 and/or associated firmware/software may reside external to the memory system 3, internal to the memory system 3, or even within media system controller 5. Thus, the media management firmware and/or software containing instructions which, when executed by the processor 7, can cause the media system controller 5 to perform operations on the memory devices 4A to 4N.

The remapping component 6 can remap units of memory for various domains. The memory domains can be used for performing error analysis. In one embodiment, the memory domain is intra-die. FIG. 8 shows one method for remapping storage elements, where the remapping confines the memory domain to a single die of a set of dice or to a portion of a die, in accordance with various embodiments of the present disclosure. In another embodiment, the memory domain is across multiple dice. FIG. 11 shows a method when remapping expands the memory domain to dice, in accordance with various embodiments of the present disclosure.

Referring to FIG. 1, the remapping component 6 can apply a forward-reverse translation to the various domains. FIG. 17 shows a method for performing forward translation to remap a defective or low performing storage element to a spare storage location, and reversing the remapping with a reverse translation when that storage element is subsequently no longer defective or low performing, in accordance with various embodiments of the present disclosure.

FIG. 2 illustrates an example portion of a structure of a memory device 10, in accordance with some embodiments of the present disclosure. The memory device 10 can be one of the memory devices 4A to 4N in FIG. 1. The memory device 10 is a three-dimensional structure of tiles 11 residing on multiple decks (shown with Deck0 and Deck1 in FIG. 2). A tile is an upper and lower deck of memory elements in a grid. The portion can include bitlines 12 running in one direction and wordlines 13 running in an orthogonal direction from the bitlines 12. The combination of bitlines and wordlines provide addressing signals to access each of the various memory elements. Bitline decoders 14 and wordline decoders 15 are present as well, to decode addresses to generate signals on the bitlines and wordlines to access the memory elements. Tiles include an upper deck (Deck1) and lower deck (Deck0) of memory (or storage) elements in a grid pattern. A wordline/bitline combination addresses each storage element. As noted earlier, storage elements (or memory elements) are storage locations (e.g., memory cells) that can be programmed to a target state or states, referred to as a bit. For binary systems, a bit (short for binary digit)

is the basic unit of data. A bit has a single binary state, either 0 or 1. In one embodiment, there are 2048 (2K) bitlines and 4096 (4K) wordlines per tile deck for a total of 16M bits or 2M bytes (8 bits/byte) on 2 decks (also referred to as levels) of a tile.

Memory device 10 may be constructed using one of a variety of materials, as well as employing different memory technology. In one embodiment, memory device 10 employs Phase Change Memory (PCM) technology, in which a change of bulk resistance of the material determines bit storage. For example, chalcogenide glass may provide the storage element, as well as the corresponding selector. Although FIG. 2 shows a particular physical structure, memory device 10 may take different physical structures in other embodiments.

Figure 3:
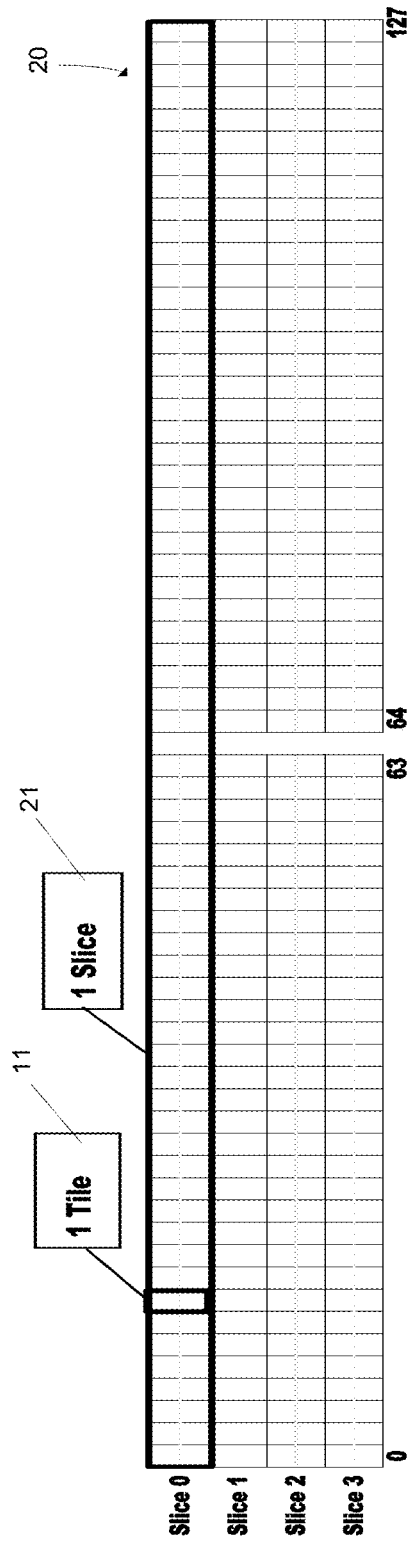
FIG. 3 illustrates a logical layout of a non-volatile memory die into a number of slices according to one embodiment.

FIG. 3 shows tiles (e.g. tile 11) aggregated into slices (e.g., slice 21), each of which may be accessed as a unit, in accordance with some embodiments of the present disclosure. In one embodiment, 128 tiles form a slice 21. Four slices form a partition 20. Spacing between bit location 63 and bit location 64 indicates a physical separation, e.g., separation of a slice by the bitline decoder 14 of FIG. 2, in accordance with some embodiments of the present disclosure. In one embodiment, media operation allows one active slice 21 per partition, but multiple partitions may be active concurrently. Other embodiments may have different arrangements in the number of slices forming a partition, physical separation(s), and/or activation.

Figure 4:
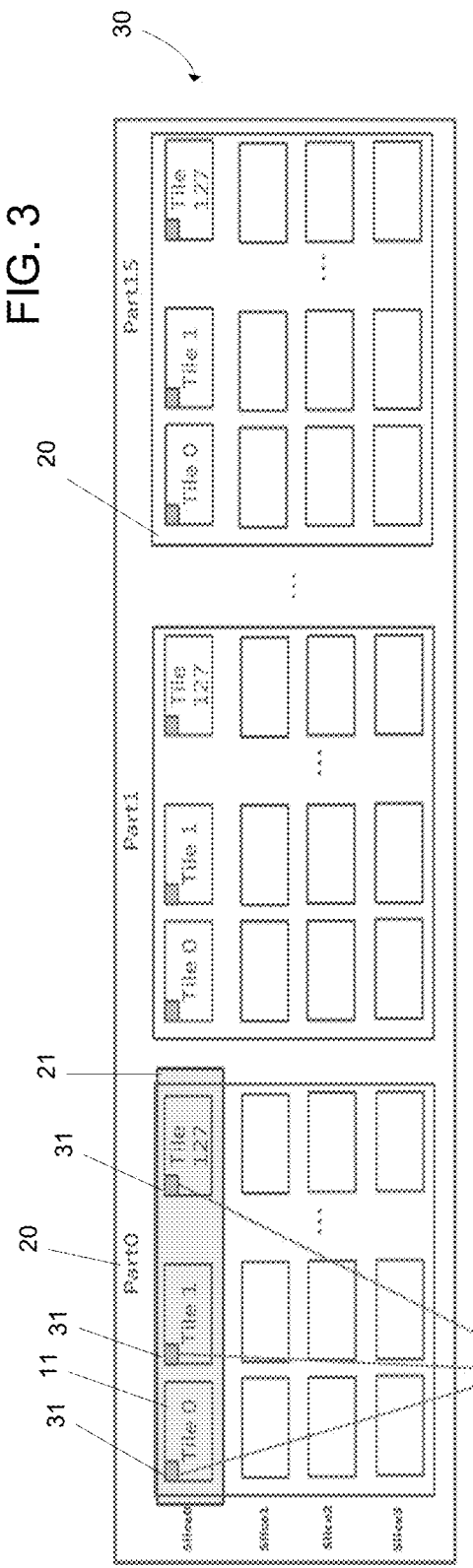
FIG. 4 illustrates a logical layout of a non-volatile memory die into a number of slices and partitions, and page/tile relationship according to one embodiment.

FIG. 4 shows a page layout in which die 30 has an allocation of sixteen partitions (noted as partitions 0-15). A page is a grouping of bits (e.g. storage elements). Each partition 20 has the four-slice partition layout of FIG. 3. A page 32 is comprised of a single bit 31 sourced from each of the 128 different tiles 11 in a slice 21 of a partition 20. In one embodiment, bit allocation from 128 tiles to form an addressable page 32 results in each partition having 67,108,864 pages and being capable of storing 1 G bytes of data. With sixteen partitions, each die can store 16 G bytes of data.

Figure 5:
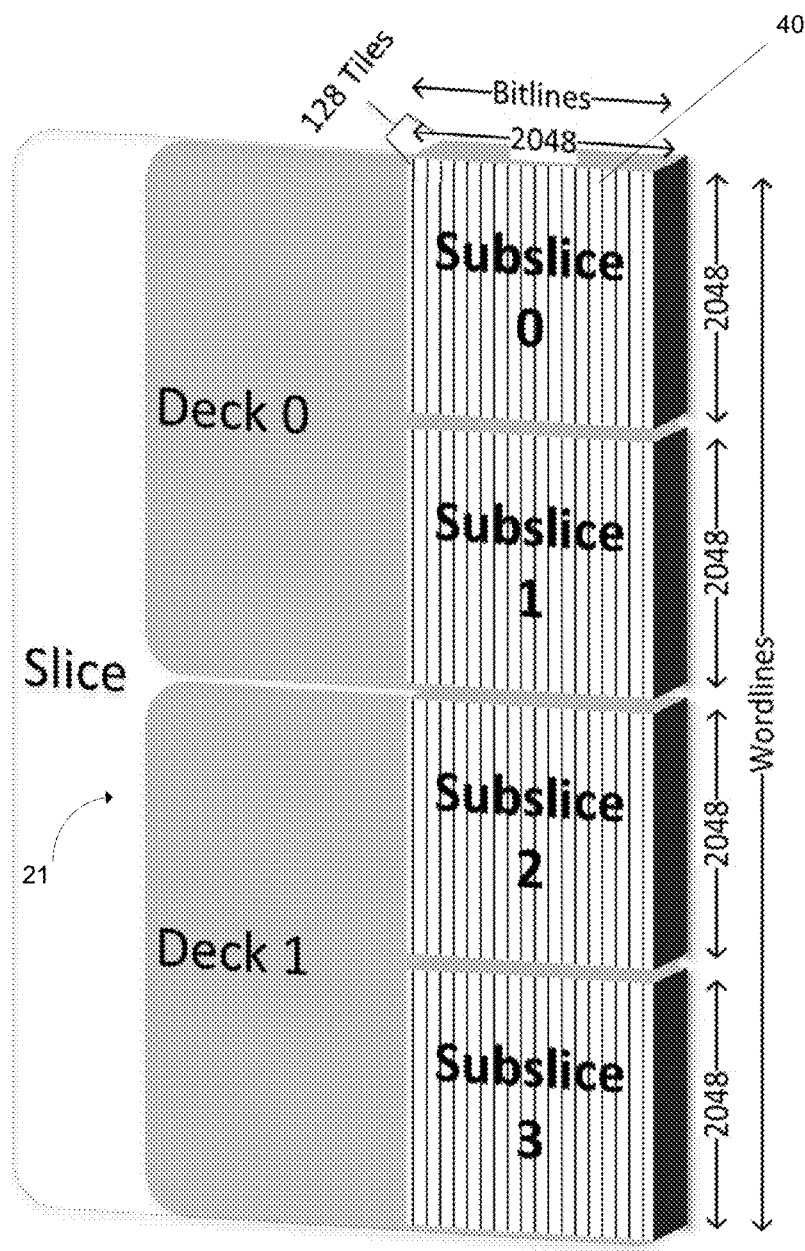
FIG. 5 illustrates an arrangement of a slice of non-volatile memory die into a number of subslices on different physical levels according to one embodiment.

FIG. 5 shows a physical layout of a subslice 40 for a given slice 21 of a partition, in accordance with some embodiments of the present disclosure. Subslice 40 is a subdivision of a slice 21 localized to a single level (deck) on memory device 10. In one embodiment, a slice 21 of a partition 20 has four subslices 40 (noted as subslices 0-3), where a pair of subslices 40 reside on each of two decks. For a given addressing scheme, this arrangement allows for a group of page ranges that are contiguous in the physical address space of a single partition, making it a logical granularity. Thus, each partition 20 comprises sixteen subslices 40 (four subslices for each slice), where half of the subslices 40 are on deck0 and the other half are on deck1. By allocating the physical portions of the memory device to have various boundaries and separations, page ranges provide granularity for defect management.

In one described embodiment, a 2048-by-2048 grid of pages totaling 4M pages defines a subslice. Each tile in the slice 21 hosting the subslice 40 contributes a 2048-2048 grid of bits (2048 wordlines by 2048 bitlines). Four such subslices 40 compose a full slice 21, as shown in FIG. 5, so a subslice 40 is a quarter-slice or half-deck across all tiles 11 in a slice 21. In such an embodiment, the subslices are self-contained proximity disturb domains. For example, a subslice 40 has no neighboring bits in either Cartesian X (row) or Y (column) direction. This is due in part to control logic placed physically at the periphery of the subslice.

FIG. 6 further illustrates the allocation of each subslice 40 and partition 20 into an M×N matrix 50, where M rows designate subslices 40 and N columns designate partitions 20, in accordance with some embodiments of the present disclosure. Using the above-described number of subslices and partitions as an example, the formed matrix is a 16×16 square matrix formed by sixteen subslices and sixteen partitions. Therefore, the formed matrix 50 contains 256 elements, each referenced as a subslice element 51. FIG. 6 shows a subslice numbering convention (#0-255) used to identify the different subslice elements 51. Thus, as shown, subslice element 51 in column 0, row 0, is number "0" and subslice element 51 in column 15, row 15, is number "255." Other embodiments may have more or fewer subslice elements 51 and may have other identification schemes.

Figure 7:
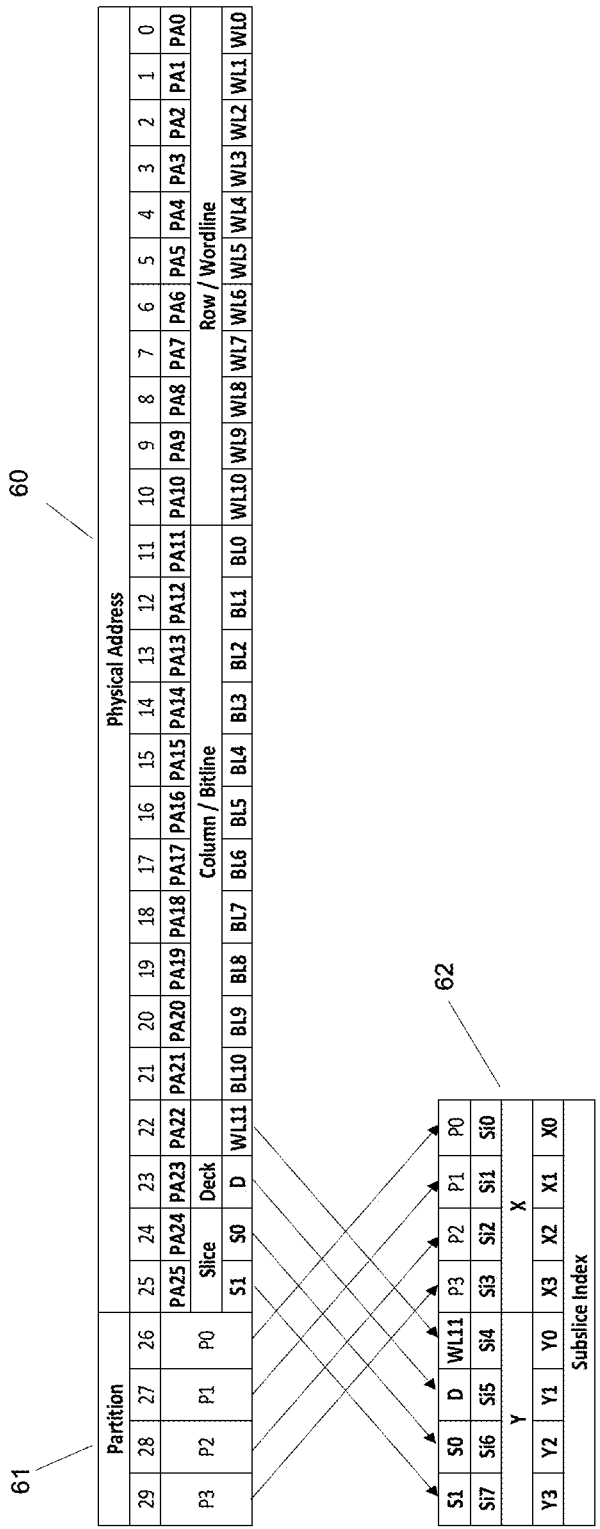
FIG. 7 illustrates a partition-physical address sub slice index transform according to one embodiment.

In the example with 256 subslice elements 51, an 8-bit value, identified as a subslice index, can index the subslice elements 51. FIG. 7 shows one technique in which a transformation of a {Partition, Physical Address} tuple provides a subslice index 62, in accordance with some embodiments of the present disclosure. As shown in FIG. 7, a physical address 60 is a 26-bit value (bits 0-25) tupled with a 4-bit partition address 61 (bits 26-29). The uppermost four bits of the physical address 60 are the most significant four bits in the subslice index 62 and the 4-bit partition address 61 is the least significant four bits. Other embodiments may use different addressing and/or indexing schemes.

Referring again to FIG. 6, matrix 50 illustrates an allocation of $1/16^{th}$ of the total subslice elements 51 of a partition 20 as spare sub slice elements 52. The allocation places the remaining 15 subslice elements 51 as user subslice elements 53 mapped to the user space of the memory 10. The allocation of $1/16^{th}$ of subslice elements 51 for spare allows for a complete row of subslice elements 51 for use as spare subslice elements 52. Because of the square matrix 50, $1/16^{th}$ allows remapping of a complete partition to the spare subslice elements. Other embodiments may allocate a larger fraction, having a power of two in the denominator (e.g. $1/8^{th}$, $1/4^{th}$, etc.), but such larger allocation to spare removes subslice elements 51 from the user pool. In the example, mapping of the spare subslice elements 52 are to the uppermost region of the physical address space (e.g., #240-#255). In other embodiments, the mapping may be to other subslice element address locations.

Having a complete row of subslice elements as spare subslice elements, sufficient spare capacity is available for a full partition's worth of redundancy on the die. Thus, a failed partition can be substituted out by associating its independent subslice elements to 16 different on-die spare subslice elements. As noted, where 15 user subslice elements 53 and one spare subslice element 52 comprise a partition, the 15 failed user subslice elements 53 can be substituted out to 15 on-die spare subslice elements 52.

Die-Scope Remapping

FIG. 8, illustrates method 70 for remapping memory in an embodiment in which a die or portion of a die defines the limit of the memory domain for remapping. Method 70 can be performed by processing logic that can include hardware (e.g., circuitry, dedicated logic, programmable logic, microcode, etc.), software (such as instructions run on a processing device), firmware, or a combination thereof. In one embodiment, the remapping component 6 of a processing device in FIG. 1 can perform method 70. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 71, processing device logically partitions memory device 10 into subslice elements. For example, the processing device may logically partition memory device 10 into 256 subslice elements 51 as described with reference to FIGS. 2-7. The processing device allocates subslice elements 51 as user subslice elements 53 or spare subslice elements 52 (block 72). In one embodiment, the initial assignment of spare subslice elements places them in the upper regions of the physical address space, e.g., as shown in FIG. 6. This region is outside the reach of user access, in contrast to the user space comprised of the lower address space.

At block 73, the processing device performs error analysis on subslice elements. In one embodiment, a suite of functionality of a scrubber component provides a software routine to perform defect (e.g. error) analysis and provides results to the processing device. In one embodiment, the scrubber component is part of the media system controller (for example, controller 5 of FIG. 1 for one embodiment). At a high level, the scrubber component is a continuous background process that is responsible for determining the Bit Error Rates (BER) of various physical and/or logical divisions of the memory, ranking the divisions, e.g., highest-to-lowest BER, and rewriting the data on the system according to the ranking, e.g., to migrate away from high-BER elements and toward low-BER elements. In one embodiment, the scrubber component determines the Raw Bit Error Rate (RBER) for the divisions of memory device and the processing device accumulates the RBER values in buckets and spare logical unit groupings. The processing device may sort RBER values to select the worst performing subslice elements. In another embodiment, the processing device may use other performance and/or reliability metrics instead of RBER.

Once error rates are known, the processing device identifies a number of the worst performing subslice elements 51 (e.g. those having the highest error rates). For RBER analysis, the processing device identifies the subslice elements 51 having the highest RBER values (block 74). The subslice elements 51 with the highest error rates in the user space are candidates for remapping to the spare space. Although the processing device may select any number of candidates for the number of worst performing subslice elements, generally all those selected candidates should have the ability to remap to spare subslice elements. Hence, in one embodiment, the number of partitioned spare subslice elements available predetermines the number of candidate subslice elements identified having the highest error rates for remapping. Alternatively, the processing device can select candidates for remapping based on user subslice elements having error rates above a threshold level, up to the number of available spare subslice elements. For simplicity of description, the embodiments herein refer to the highest error rates, yet the error rates may be applicable to exceeding a threshold level, as well as use of other criteria.

Continuing the example described with reference to FIG. 6, the processing device logically partitions 256 subslice elements for a given die, of which subslice elements #0-239 are user subslice elements 53 and subslice elements #240-255 are spare subslice elements 52. Since, in this embodiment, the processing device partitions sixteen subslice elements 53 as spare subslice elements 52, the processing device performing method 70 looks to identify sixteen worst (highest error rate) subslice elements, when identifying the subslice elements (both user and spare) having the highest error rates. The processing device provides an indication to identify the subslice elements having the highest error rates. In one embodiment, the processing device sets a bit in a corresponding bitmap for each of the subslice elements having the highest error rates (block 74). Other embodiments may use other indications to note which subslice elements have the highest error rates.

Once the processing device performing method 70 identifies the user subslice elements having the highest error rates, the processing device remaps these user subslice elements to available spare subslice elements 52 in the spare region of subslice row 15 and enters location information for remapped user subslice elements in subslice substitution data structure (block 75). For example, the processing device performing method 70 remaps user subslice elements using a data structure, as described with reference to FIG. 9. In one embodiment, the remapping includes the processing device reading the contents of each subslice element having a highest error rate and writing the content to a spare subslice element.

Figure 9:
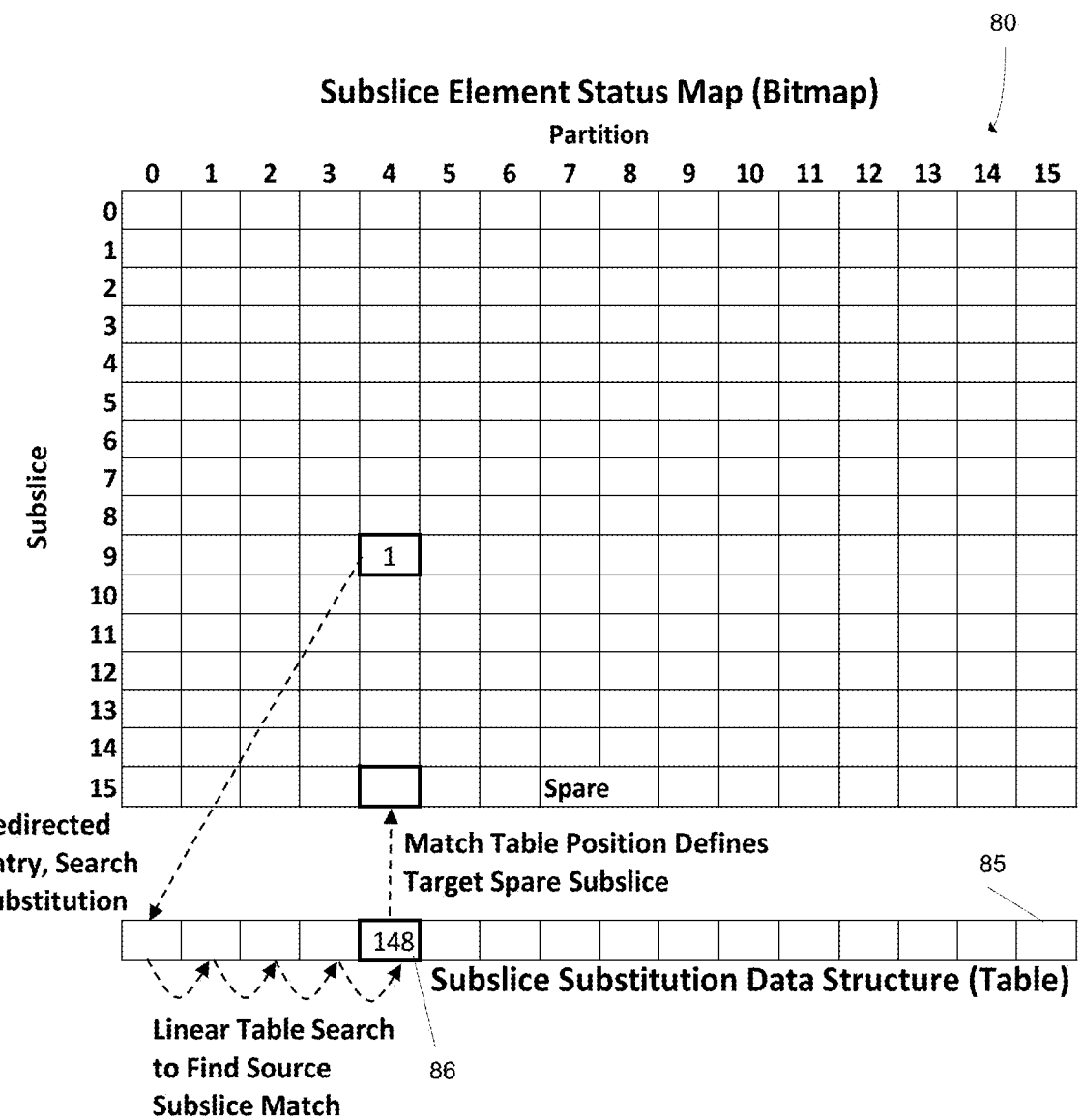
FIG. 9 illustrates use of a subslice element status map and a subslice substitution data structure to perform forward address translation for remapping a subslice element according to one embodiment.

In order to track which of the subslice elements 51 have the highest error rates for remapping, a subslice element status map provides a mechanism to identify these worst (e.g., higher or highest error rate) subslice elements. FIG. 9 illustrates use of a subslice element status map and a subslice substitution data structure to perform forward address translation for remapping a subslice element, in accordance with some embodiments of the present disclosure.

In one embodiment, a subslice element status map 80, shown in FIG. 9, has equivalent mapping as matrix 50 of FIG. 6. That is, subslice element status map 80 provides one-to-one mapping of the subslice elements of matrix 50, so that entries at corresponding locations of the map 80 can identify if a corresponding subslice element in the matrix has one of the highest error rates. In one embodiment, subslice element status map 80 is a bitmap, so that a bit value in a given entry of the subslice element status map 80 identifies the status of the corresponding subslice element in matrix 50. In another embodiment, subslice element status map 80 is another type of data structure.

In the example shown in FIG. 9, subslice element #148 (subslice 9, partition 4) is found to have one of the worst error rates after an error analysis. Hence, a bit is set for this corresponding location in the subslice element status map 80. The remapping component performs this procedure for each of the subslice elements found to have the highest error rates. When the scrubbing function of the remapping component finds all of the highest error candidates and corresponding bits set in the subslice element status map 80, the remapping component may access map 80 to determine which user subslice element(s) in rows 0-14 require remapping.

The value in each field in the map 80 indicates whether the subslice element is in-situ (0), not remapped, or remapped (1). For the $\frac{1}{16}^{th}$ spare model, this bitmap supports up to 16 redirections (remaps). Another interpretation is that the bitmap indicates whether the subslice element is reliable (0) or unreliable (1). Reliable subslice elements can contain user data and the 16 unreliable subslice elements remain unused (become new spares or are otherwise removed from the user space) when remapped to spare subslices. Thus, a set bit (1) in an entry in the subslice element status map 80 indicates, not only the worst candidates, but also the redirection (remapping) of those user subslice elements. If an initially designated spare subslice element were one of the worst performers, however, that spare subslice element would not be available for the remapping of one of the user subslice elements. Each die contains 256 subslice elements for tracking in its associated bitmap, so that each die has a similar map 80. Although subslice element status map 80 is a bit map, other embodiments may use various other mapping techniques (such as tables, status flags, metadata, etc.) to indicate which user subslice elements are in-situ or remapped.

In order to implement an embodiment of remapping, each die has a second, complementary table structure called a subslice substitution data structure 85. In one embodiment, subslice substitution data structure 85 is a table. Other embodiments may have other data structures. In this instance, subslice substitution data structure 85 covers only spare subslices. As shown in FIG. 9, the position (0-15) of the entry in the table defines which spare subslice element to which the entry corresponds. For example, the entry at position or offset 2 in the table corresponds to spare subslice element 2, shown numbered #242 in matrix 50. Hence, the offset implies the partition location. Here the remapping of subslice element 148 is to the spare subslice element 86 at offset 4 in the subslice substitution data structure 85.

Accordingly, a subslice element identified for remapping, such as subslice element #148 (partition 4, subslice 9), has the bit set in the subslice element status map 80 corresponding to location #148. Upon locating a vacant spare subslice element that is available for remapping, the remapping component performing method 70 of FIG. 8 enters the subslice element number #148 in the subslice substitution data structure 85, where an index (e.g., an offset) of the substitution data structure 85 identifies the partition of the spare subslice element. The vacated subslice element location #148 is now an unused spare, since all accesses to location #148 are remapped to access the subslice element of the redirected location, which is #244 (partition 4, subslice 15) in the example. That is, location #244 contains data designated for location #148.

For accesses (such as for read, write, and/or erase) to the die, the remapping component consults the subslice element status map 80 first to determine if the respective subslice element for the storage element location being accessed is in-situ (e.g. original location) or redirected. In one embodiment, a bit value of "0" indicates that the subslice element is still present (in-situ) and the access at that location is valid. Alternatively, a bit value of "1" indicates the remapping (redirecting) of the subslice element to a spare subslice element location, and that the original location is invalid. Aspects of the present disclosure describe that when remapping by the remapping component is present, the access protocol running on the remapping component searches through the subslice substitution data structure 85 to locate the subslice element number. Once the remapping component finds the corresponding subslice element number, the index location (e.g. offset) is determined to locate the target partition. In FIG. 9, searching for and finding subslice element #148 at offset #4, indicates that the accessed subslice element #148 is now remapped and located in the spare subslice element row at partition 4, which is subslice element #244. Thus, the physical location at subslice element #244 is now the remapped subslice element #148. In an alternative embodiment, the remapping component maintains one data structure with an entry for each subslice element and looks up each access in the data structure 85, instead of accessing subslice element status map 80 and the subslice substitution data structure 85. In this instance, subslice element status map 80 is not used.

Figure 10:
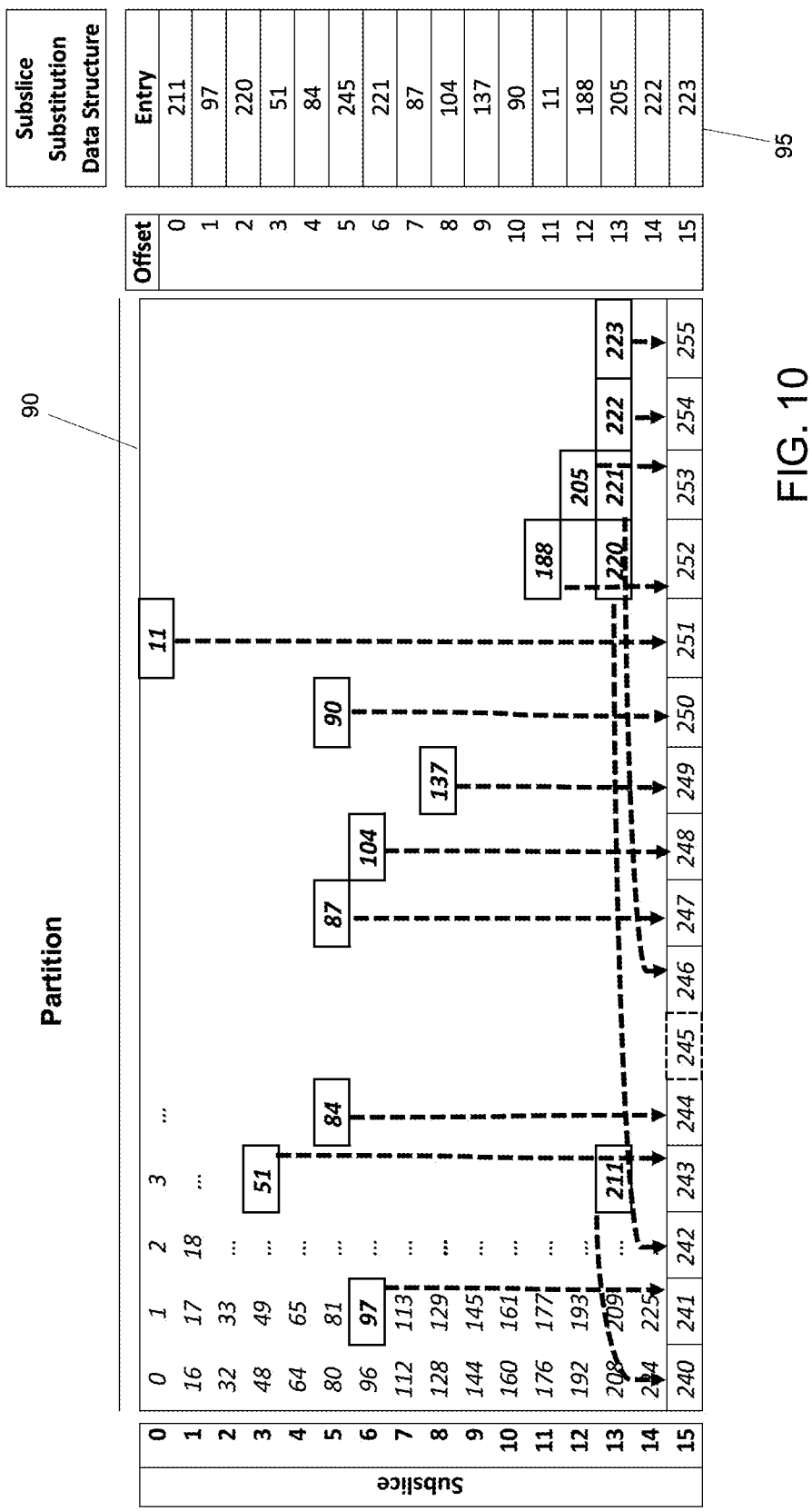
FIG. 10 illustrates an example diagram for remapping user subslice elements having highest error rates to available spare subslice elements for a memory domain confined to a die according to one embodiment.

FIG. 10 illustrates an example of performing an RBER analysis on the 256 subslice elements and remapping those user subslice elements with highest RBER to available spare subslice element locations, in accordance with some embodiments of the present disclosure. For a matrix 90 having 256 subslice elements, the remapping component identifies sixteen highest RBER candidates, since there are sixteen spare subslice elements. Note that the number of highest RBER candidates to find is predetermined in one embodiment, since it coincides with the number of spare subslice elements partitioned. Other embodiments may use different criteria. As described above, the RBER analysis pertains to all subslice elements, including the spare subslice elements.

In the example of FIG. 10, fifteen subslice elements in the user space and one subslice element (#245) in the spare space have the highest RBER (element #245 shown in dashed line to illustrate a spare being among the highest RBER). Having one or more highest RBER candidate(s) in the spare space does not present a problem, because the number of user subslice elements having highest RBER is reduced by the same count. Thus, FIG. 10 shows fifteen user subslice elements for remapping. After setting corresponding bits in the subslice element status map 80, to indicate the highest RBER candidates, the remapping of the fifteen user subslice elements commences.

Any of a variety of techniques may perform the remapping. One embodiment follows the following sequence performed by the remapping component. In some embodiments, the remapping component is part of the controller, such as with remapping component 6 being included as part of controller 3. The remapping component identifies and initializes the subslice element status map 80 and the subslice substitution data structure 85 for a given die. The remapping component performs error analysis of all subslice elements for the die and sorts the list of highest RBER subslice elements from lowest to highest index. The remapping component identifies the sixteen worst subslice elements based on RBER and sorts this list of subslice elements. Some of these subslices may correspond to initially-designated spare subslices. The remapping component identity maps any initially designated spare subslices by noting itself at the spare location.

The remapping component processes the sorted list and identifies any highest error subslice elements that were initially-designated spare. Subslice elements with indices between #240 and #255 inclusive are initially-designated spares. In the example of FIG. 10, there is one highest error subslice element that is initially-designated spare, which is subslice element #245. For each initially-designated spare subslice, the remapping component identity maps (or maintains the identity-mapping of) its corresponding position in the subslice substitution data structure 85. Subslice element #245 is the only candidate shown and it exists at offset 5 in the table. As noted above, this offset is the same value as the partition index on which the initially-designated spare lies (identity mapped). The subslice element status map requires no changes for remapping initially-designated spare subslices.

The remapping component processes the sorted list of highest RBER subslices and, for each entry, set the corresponding bit in the subslice element status map 80. Additionally, the remapping component selects an appropriate unused offset in the subslice substitution data structure 85 (that isn't among the highest RBER, when applicable) and writes the index of the highest error subslice element into that offset. In one embodiment, the preference is to remap a user subslice element to a spare location in the same partition, if feasible. In FIG. 10, using a sorted list of subslice elements, the first highest error subslice element index is #11 in partition #11. The remapping component remaps subslice element #11 to the spare subslice element #251, which is in partition #11 as well. Searching the subslice substitution data structure, the spare subslice element on partition #11 (subslice element #251) is unused and not among the highest RBER, therefore the optimal assignment. The remapping component remaps subslice element #11 to spare subslice element #251 by writing the value '11' into offset 11 (which corresponds to spare subslice element #251) in the subslice substitution data structure.

By continuing to process through the sorted list of highest error subslice elements, the remaining highest RBER user subslice elements remap to available spare subslice elements. In some instances, mapping a highest error subslice element to a spare subslice element in the same partition may not be possible (the spare in the partition is either bad/among the highest error subslices or already taken by another highest error subslice element in the partition). When a spare subslice element in the same partition is not available, the remapping component skips the remapping on the first pass and, once the first pass of remapping subslice elements within partitions is done, the remapping component remaps the skipped user subslice element(s) to remaining spare subslice element(s) in other vacant partition(s). FIG. 10 shows subslice element #211 remapped to spare #240, #220 to #242, and #221 to #246. When completed, the subslice substitution data structure 95 has the entries as noted for corresponding offset 0-15. Note that offset 5 has the identity entry of the spare subslice element #245, since this element is one of the highest error subslice elements of the RBER list.

The above example assumes that the memory domain for performing the error analysis and remapping is the complete die (intra-die). That is, the error analysis to find the highest error RBER subslice elements treated the complete die as the memory domain. However, in other embodiments, the remapping component can logically divide a die to include more than one memory remapping domain. For example, a single partition may suffice as a memory remapping domain, in which case, there would be sixteen memory remapping domains on the die, one for each partition. A highest RBER search would find the worst subslice element for each memory remapping domain and map that respective subslice element to the spare location in the same partition. Other embodiments may have more than one partition (such as 2, 4, or 8) as the memory remapping domain in one die. However, the above examples and embodiments treated the memory remapping domain to be within one die, so that a multiple dice or system would perform equivalent remapping scheme for each die of a set of dice forming the memory device (or system). A set can include multiple dice.

Channel-Scope Remapping

As noted above, a set of dice of memory system may include a memory remapping domain. However, if a memory system contained 128 dice, 256 dice, or more, extending the memory remapping domain to all the dice places an undue burden to provide the mechanism for remapping. Thus, a subset that takes into account multiple dice allows for a manageable memory remapping domain. In one embodiment, a scheme referred to herein as channel-scope remapping allows for a manageable number of dice to provide a memory remapping domain. A channel is a bus shared between or among two or more physical or logical dice or a subdivision of a group having at least two dice. Typically, the subdivision occurs if the channel is segregated into dice groups to reduce the capacitive load on that channel (e.g. to run at higher speed). Therefore, in one embodiment, a channel provides common wordlines and bitlines to a group of dice using those common wordlines and bitlines. A subdivision of a channel would be a subgroup of dice residing on the channel.

FIG. 11 illustrates method 100, which extends the memory remapping domain to more than one die, in accordance with some embodiments of the present disclosure. Method 100 can be performed by processing logic that can include hardware (e.g., circuitry, dedicated logic, programmable logic, microcode, etc.), software (such as instructions run on a processing device), firmware, or a combination thereof. In one embodiment, the remapping component 6 of a processing device in FIG. 1 can perform method 100. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

The procedures between having a memory remapping domain confined or limited to a single die (intra-die) versus extending the memory remapping domain to multiple dice (inter-die) takes into account the extent of the available spare subslice elements across the memory domain. At block 101, processing device partitions logically each NVM die of the memory domain into subslice elements. The processing device allocates user and spare subslice elements for each NVM die (block 102). This allocation for each die is similar to the procedures outlined in blocks 71 and 72 for a single die. In contrast to method 70, however, processing device operates on a different memory remapping domain when performing the error analysis (block 103). For example, if the memory remapping domain extends over (covers) eight dice, the processing device combines and analyzes the subslice elements of all eight dice as a single domain.

Following the earlier described example of 256 subslice elements, of which the highest sixteen form the spares, there will now be 128 (8×16) spare subslice elements out of a total number of 2048 (256×8) subslice elements. An 11-bit addressing scheme allows access to the 2048 subslice elements. Therefore, the error analysis will identify a number of subslice elements, for example 128 subslice elements, having the highest error rates (e.g. RBERs). The processing device performs an error analysis utilizing a scrubber component or other equivalent functionality to identify the subslice elements of the domain having the highest error rates (block 104). In one embodiment, the processing device provides an indication by setting a bit in a corresponding bitmap for each of the subslice elements having the highest error rates (block 104). Other embodiments may use other indications to note which subslice elements have the highest error rates. Furthermore, as noted earlier, the processing device may base the error analysis on reaching a threshold level of error. Other embodiments may employ other error analysis techniques.

Similar to die-scope remapping, the multi-die technique uses the subslice element status map 80 and the subslice substitution data structure 85 for the domain. However, because the processing device may identify similarly positioned subslice elements of each die with the same number, an additional die index provides for differentiation. Thus, each subslice element uses a tuple comprised of the subslice element number and a die index (e.g., #0-7 for an eight dice memory domain). A 3-bit die index prepended to the previously described 8-bit subslice element index (11 total bits) allows access to each individual subslice element of the memory domain in this example. Using additional die index bits allows memory domain expansion to additional number of dice.

Once the processing device performing method 100 identifies a list of highest RBER subslice elements, the processing device, for each die in the domain, maps any initially designated spare subslice elements on that die having the highest error rates by writing the index of that subslice and the die index (identity mapping) into the corresponding entry in the subslice substitution data structure (e.g. Table). These highest error rate spare subslice elements are not available for remapping of user subslice elements.

For each die in the memory domain, the processing device sets bit(s) in the corresponding subslice element status map (e.g. Bitmap) entry for user subslice elements to indicate remapping of that user subslice element. The processing device performs a remap of the user subslice elements having the highest error rates and enters location information for the remapped user subslice elements (block 105). The processing device remaps the user subslice elements, for each die in the remapping domain, by processing the list of identified highest error rate user subslice elements for that die. In one embodiment, the procedure starts at element #0 and proceeds to #255 (e.g., low to high). In one embodiment, as described with reference to FIG. 10, the processing device remaps within the same partition when possible. For each subslice element that shares the same partition with an unused spare subslice on that same die, the processing device creates a redirection for it by writing the die index for that die into the target die index portion of the corresponding source subslice element status map tuple. The processing device writes the index of the source subslice element and the current die index into the tuple at the corresponding offset in the subslice substitution data structure (e.g. table) (block 105). The processing device marks the entry in the subslice substitution data structure and removes the highest error user subslice element location from the user space. At this point, all substitutions are die-local and within the same partition.

As stated above, mapping a highest error subslice element to a spare subslice element in the same partition may not be possible in some instances. When a spare subslice element in the same partition is not available, the processing device skips the remapping on the first pass and, once the processing device completes the first pass of remapping subslice elements within partitions, the processing device remaps the skipped user subslice element(s) to remaining spare subslice element(s) in other vacant partition(s) within that die. For example, for each die in the domain, the processing device processes the list of the remaining subslice elements for that die, low to high. If there are subslice elements left that were not handled in the previous remap, the processing device remaps them to the remaining unused entries in the subslice substitution data structure for that die in a low to high order. The target die index in each element's subslice element status map tuple is set to the current die, and the processing device writes the subslice index and current die index into the corresponding subslice substitution data structure tuple. These subslice elements are then removed from the user space. At this point, all substitutions are still die-local but may have redirected a subslice element to a spare subslice element on a different partition on the same die.

In some instances, mapping a highest error subslice element to a spare subslice element in the same die may not be possible. For each die in the domain, the processing device processes the list of the remaining subslice elements for that die, low to high. If the processing device cannot remap user subslice elements to spare subslice elements on the same die, because no spare subslice elements are left on that die, the processing device assigns them to the remaining unused entries in the subslice substitution data structure for any other die on the memory domain in a low to high order, e.g. die #0-#7 (block 106). For each subslice element, the target die index in the source die subslice element status map tuple for that entry is set to the target die index for the chosen unused spare subslice element. For the corresponding subslice substitution data structure entry tuple, the die index is set to the source die and the subslice element index set to the source subslice element. At this point, the processing device has mapped all user subslice elements with highest error rates to spare subslice elements, first to the same die and remaining subslice elements to another die in the same memory remapping domain.

FIG. 12 illustrates one example diagram 110 for performing method 100 of FIG. 11, in accordance with some embodiments of the present disclosure. Using an eight-die memory remapping domain, after a RBER collection pass of the eight dice (#0-7), diagram 110 shows an example of subslice elements having the highest error rates. In FIG. 12, six of the dice have sixteen highest error RBER subslice elements, while die #6 has more than sixteen and die #7 has less than sixteen. The diagram 110 also shows initially designated spare subslice elements with highest error RBER (shown in solid boxes), including all of the spare subslice elements of die #3.

Figure 13:
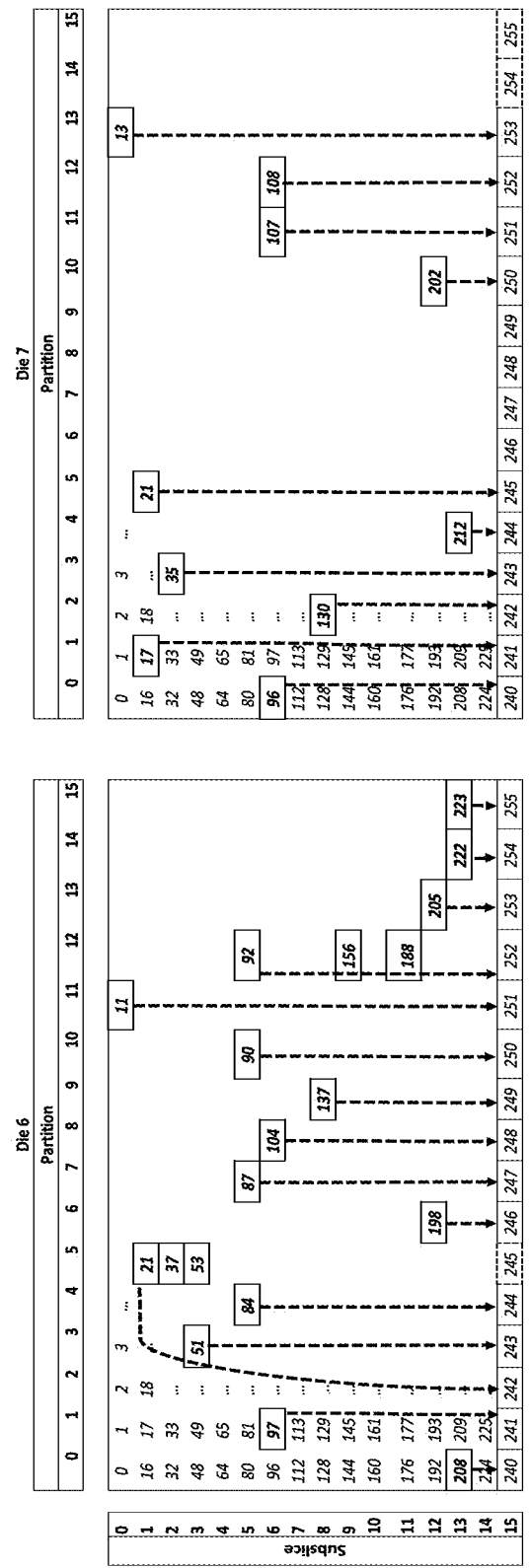
FIG. 13 illustrates an example diagram for remapping user subslice elements having highest error rates to available spare subslice elements on respective dice for two of the dice shown in FIG. 12 according to one embodiment.
Figure 14:
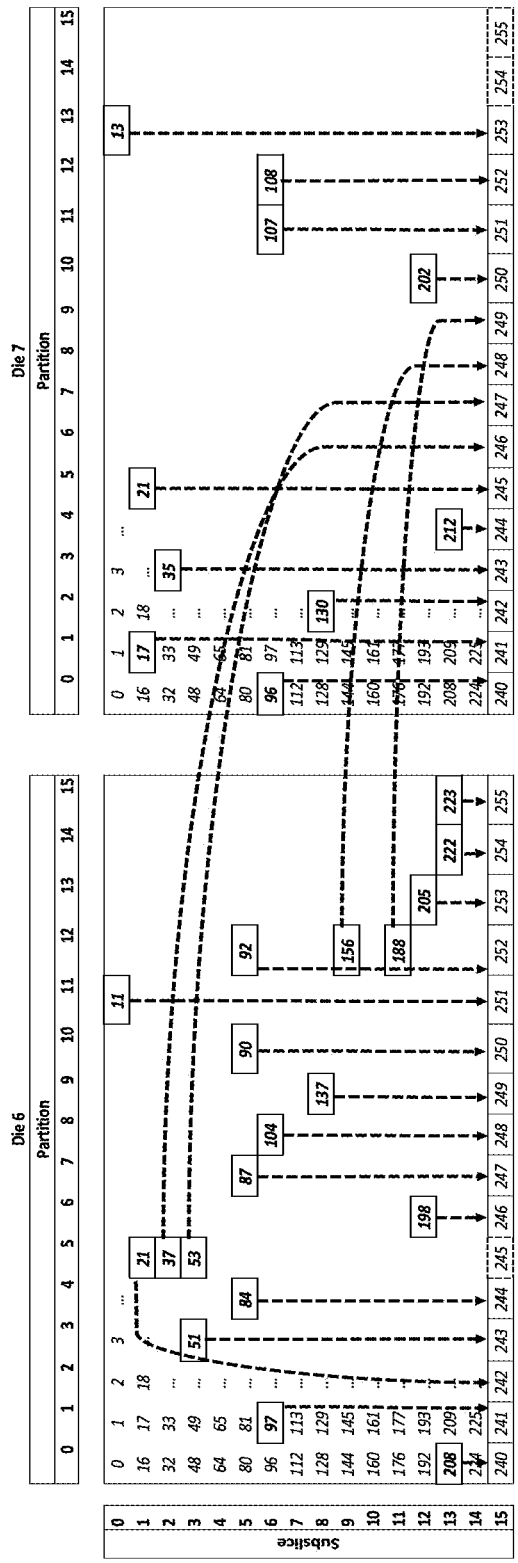
FIG. 14 illustrates a continuation of the remapping of FIG. 13 to remap user subslice elements having highest error rates that remain to be mapped on a first die to available spare subslice elements on a second die for the two dice according to one embodiment.

FIG. 13 and FIG. 14 illustrate an example of performing an RBER analysis on each of the 256 subslice elements of die #6 and die #7 illustrated in FIG. 12 and remapping those user subslice elements with highest RBER to available spare subslice element locations within the memory remapping domain as illustrated in FIG. 12, in accordance with some embodiments of the disclosure. Although the memory remapping domain encompasses eight dice in this example, the explanation centers on only die #6 and die #7 to illustrate on-die and off-die remapping. As illustrated in FIG. 12, die #6 has twenty highest RBER subslice elements, of which one is a spare subslice element, and die #7 has twelve highest RBER subslice elements, of which two are spare subslice elements. Therefore, die #7 can remap within the die, but die #6 will need to remap some of the highest RBER subslice elements to another die. Since the example shown in diagram 110 includes the same number of highest RBER subslice elements as on-die spare subslice elements for dice 0-5, these dice can map within the die.

In FIG. 13, the highest RBER subslice elements of die #7 are capable of remapping within the die and within the same partition. However, for die #6, the first pass through the highest RBER candidates allows fourteen RBER subslice elements to map to spare subslice elements of the same partition. Subslice element #245 of die #6 is among the highest RBER (shown in dashed line), so it cannot be a spare target for the remap of a highest error RBER user subslice element. In a second pass, the remapping component maps subslice element #21 to spare #242, which is in a different partition but within the same die. Still remaining for remapping are subslice elements #37, #53, #156 and #158. Since no other spare subslice elements are available within die #6, these last four are redirected off die and remapped to available spare subslice elements of die #7 (inter-die remap), as illustrated in FIG. 14.

FIG. 14 shows remapping, in accordance with some embodiments of the present disclosure. Subslice element #37 of die #6 is remapped to spare subslice element #246 of die #7, subslice element #53 of die #6 remapped to spare subslice element #247 of die #7, subslice element #156 of die #6 remapped to spare subslice element #248 of die #7, and subslice element #188 of die #6 remapped to spare subslice element #249 of die #7. This inter-die remapping is due to die #6 having more user subslice elements with highest error rates than available spare subslice elements on the die #6.

Following this remap, the remapping component has remapped all highest error subslice elements in the memory remapping domain. FIG. 15 shows the final disposition of a multi-die subslice substitution data structure (e.g. table) 140, showing the remapped subslice elements (or identity mapping in the case of spare subslice elements, which are not remapped) in each die of the memory domain with corresponding offsets. The entries not only indicate the subslice element number, but also the die index, to identify the original source location, including the die.

The group of dice #0-7 may be all dice on a channel (having common wordlines and bitlines) or may be just a portion (subdivision) of the dice on the channel. In another embodiment, there may less or more dice on a channel. The ability to define a memory remapping domain stretching across a plurality of dice allows for determination of highest RBER subslice elements over the multiple-die domain instead of limiting the domain to one die, or part of one die. For example, with a 16-dice grouping, the remaining 15 spare rows on fifteen dice can fully accommodate remapping all user subslice elements from a failed die. Also, for media with a large number of dice (e.g. 128, 256, etc.), multiple sets of such channel die grouping or subdivision grouping of a channel can form a plurality of memory remapping domains across the media.

Forward-Reverse Translation

Figure 16:
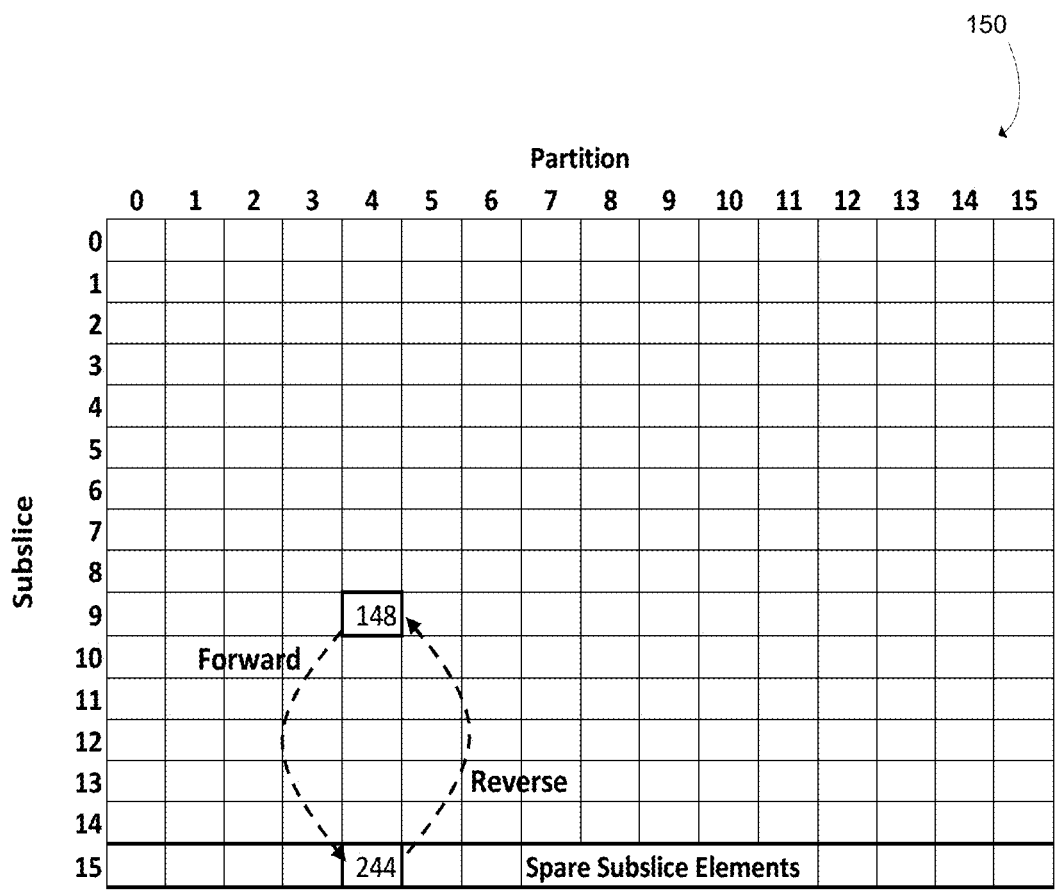
FIG. 16 illustrates forward and reverse translations of a subslice element to restore a remapped user subslice element back to its original location when that original location no longer has the highest error rates according to one embodiment.

FIG. 16 shows another feature of the remapping embodiments of the disclosure. The example remapping of FIG. 16 shows the subslice-partition arrangement 150 for one remapped subslice element, but forward-reverse translation is applicable to multiple dice, depending on the memory remapping domain selected. Thus, any of the earlier described techniques are applicable for the forward and reverse translation described below.

As shown in FIG. 16, user subslice element #148 remaps to spare subslice element #244 within the same partition utilizing one of the remapping method described above. FIG. 16 shows this as "Forward" translation. As described earlier, subslice element #148 may map to another partition (if element #244 is not available) or even map to a spare subslice element of another die for a memory domain expanded across multiple dice. Because the subslice substitution data structure maintains the record of this remapping of user subslice element #148 to spare subslice element #244, the processing device can undo (e.g. reverse) the remapping to return subslice element #148 as an active element in its original location. FIG. 16 shows this undoing of the remapping from #244 to #148 as "Reverse" translation.

The forward-reverse translation permits not only the original redirection of user subslice elements to spare subslice element locations, but enables the remapping component to undo any of the forward translations by performing the reverse translation. Typically, after the remapping of highest RBER user subslice elements and designating the now vacant elements as spare locations or otherwise not accessible by the user, all the highest RBER elements now reside outside of the user space. However, over time, whether due to the activity on the NVM, change in disturb relationships, or deterioration of storage cell condition over time, the RBER values may change. The change in RBER of the subslice elements may also change the list of the highest RBER candidates. In order to adjust for changing RBER candidates for remapping, one embodiment performs error analysis periodically on the subslice elements of the NVM dice. The remapping component performs this operation for whichever memory domain is in use.

When the old and the new RBER lists are different, that difference indicates that one of more subslice element(s) from the first list is/are no longer the highest RBER, while other(s) which were not in the highest RBER list is/are now in the highest RBER category. Performing only forward translation could limit embodiments to a single remapping. For example, since the spare subslice element locations are already occupied by remapped user subslice elements, further remapping would need to access other locations or have more spare subslice elements. However, if the subslice elements that remapped to the spare space #240-255, can have the remap reversed, then the original spare locations can return to the user space for the next round of remapping.

FIG. 17 shows a flow chart of a method 160 to perform forward translation for remapping of a first set of highest RBER candidates, performing a reverse translation of the first remap and performing a second forward translation of a subsequent set of highest RBER candidates, in accordance with some embodiments of the present disclosure. A processing logic can perform method 160, which processing logic can include hardware (e.g., circuitry, dedicated logic, programmable logic, microcode, etc.), software (such as instructions run on a processing device), firmware, or a combination thereof. In one embodiment, the remapping component 6 of the processing device in FIG. 1 can perform method 160. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

The processing device performing method 160 performs an error analysis on subslice elements to find a first group (noted as group A) of subslice elements having highest error rates (e.g. highest RBER) (block 161). In one embodiment, the processing device sets bit entries in a first subslice element map (e.g. Bitmap A). From a list of highest RBER subslice elements of group A, the processing device remaps highest RBER user subslice elements to available spare subslice elements (block 162) in a forward translation. Remapped subslice elements have their identification entered in a subslice substitution data structure (e.g. Table A). In one embodiment, this portion of method 160 employs one of the earlier described methods for remapping, whether the memory remapping domain is intra-die or inter-die.

The processing device performs a second error analysis to determine a new highest RBER group (noted as group B) (block 163) and set bit entries in a second subslice element status map (e.g. Bitmap B). The processing device compares corresponding entries of the two bitmaps to identify user subslice elements of group A that no longer have the highest error rate according to group B. If Bitmap A and Bitmap B entries are identical, the method requires no further action.

However, when there are differences between the two bitmaps, then one or more subslice element(s) has/have changed respective RBER ratings. In that instance, the method identifies user subslice elements of Bitmap A that no longer have the highest RBER (block 164). The processing device reverse translates the remapping of those subslice element(s) to restore the original subslice element mapping for those subslice element(s) that no longer have the highest RBER. For example, the processing device copies the content from the spare subslice elements subject to the reverse translation back to their original subslice elements, vacating spare subslice element locations in the spare row (that is, the original spare locations) for new remapping and returning the previously remapped subslice element to its original location in the user space (one of element locations #0-239) (block 165). The reverse translation frees the spare subslice element, so that it is again a valid spare, provided the spare subslice element is not one of the elements having the highest error rates in the second error analysis. The processing device remaps the new user subslice elements with the highest RBER based on Bitmap B and generates new entries to enter location information in Table B for the user subslice elements that remapped under group B (block 166).

Note that performing the first remapping through first forward translation, reverse translating those user subslice element locations that no longer have highest RBER, and remapping new highest RBER subslice element through second forward translation may take many forms. In one embodiment, the processing device performs the reverse translation only on those user subslice elements that changed between the two lists of group A and group B and remaps the new highest RBER user subslice elements. In that instance, Table B may be created from Table A and then have corresponding entries changed due to the reverse translation and the second remapping.

In another embodiment, the method performs a complete reverse translation on all remapped subslice elements to return them to their original user subslice element locations and then performs the complete remap as outlined earlier in this disclosure. This technique requires additional processing, however, by following the procedure outlined earlier, such as filling the spare subslice element of the same partition first, another partition of the same die next, followed by filling partitions on another die, an orderly manner of controlling proximal disturb relationships may continually be maintained, as though the second remapping is no different from an initial remapping.

With the second remapping, the processing device no longer needs Bitmap A and Table A, since the collected data of group A is now stale. Hence, Bitmap B and Table B become the new Bitmap A and Table A (block 167). In one technique, entries are copied from Bitmap B to Bitmap A and Table B to Table A. In another technique, the two pair sets alternate to receive the newest data entries. Utilizing two sets of subslice element status maps and subslice substitution data structures, the processing device may use one bitmap and table to hold current information while the second collects and processes new information. Furthermore, as described above in an alternative embodiment, instead of using a subslice element status map and a subslice substitution data structure, a single status structure may provide both functions and all accesses to the user space access the status structure to identify the target location, whether remapped or not.

An aspect of the forward-reverse translation allows the processing device to perform error analysis on subslice elements mapped out of the user space. Without the reverse translation, once the processing device remaps a user subslice element, that location is no longer available for use by a process using user space addressing. Any unused spare location for remapping would also not be available for use by a process using user space addressing. Using the reverse translation, the scrubber component is able to access and evaluate subslice elements. By including those subslice elements in the ranking of highest RBERs and performing remapping based on those rankings, spare subslice elements are available again for highest RBER analysis under dynamically changing conditions.

Because an embodiment of the allocation scheme defines the address location of the subslice elements in the user space and the subslice elements in the spare space, the processing device (e.g., using the scrubber component), is aware that an access to the user space location is always a forward translation, since the remapping is from the user space to the spare space. Likewise, the processing device is aware that an access to the spare space location is always a reverse translation. Thus, in an embodiment where the spare space location is in an upper address range, an access to that address range indicates that the translation is in the reverse direction. Furthermore, the forward translation and the reverse translation has a one-to-one relationship, so that a forward remapping of a subslice element always has a unique reverse translation, which puts the remapped subslice element always back to its original location. Thus, in one embodiment, the placement of addresses in the upper hidden portion of the address space allows the processing device to sample those addresses where the address range implies reverse translation.

By continually performing highest error rate analysis, potential error causing storage cells may be located and placed into spare status. Therefore, in one embodiment, a scrubber algorithm continually re-evaluates and ranks the subslice elements to identify the set of worst offenders (highest error rates) as a dynamic group, reflecting the dynamic nature of media deterioration with cycles or other catalysts driving an error rate (e.g. RBER) higher.

An article of manufacture may store program code providing at least some of the functionality of the embodiments described above. For example, the methods illustrated in the flow charts of FIGS. 8, 11, and 17. Additionally, an article of manufacture may store program code created using at least some of the functionality of the embodiments described above. An article of manufacture that stores program code may be embodied as, but is not limited to, one or more memories (e.g., one or more flash memories, DRAMs, SRAMs, and others), optical disks, CD-ROMs, DVD-ROMs, EPROMs, EEPROMs, magnetic or optical cards or other type of non-transitory machine-readable media suitable for storing electronic instructions.

This disclosure describes specific exemplary embodiments and references accompanying drawings to illustrate the various embodiments. The description above and drawings are illustrative only and are not for limiting the embodiments. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when an embodiment describes a particular feature, structure, or characteristic, other embodiments may implement such feature, structure, or characteristic, whether or not explicitly described.

Furthermore, the disclosure references memory devices and media. For purposes of explanation, memory devices are a type of media. Similarly, in regards to the subslice element status map, it may be used interchangeably with the term "bitmap" throughout in the explanation, however, a bitmap is just one type of subslice element status map. Similarly, in regards to the subslice substitution data structure, it may be used interchangeably with the term "table" throughout in the explanation, however, a table is just one type of data structure that. Also "higher error rate" or "highest error rates" may be used interchangeably and with "higher RBER" or "highest RBER" throughout in the explanation, however, RBER is just one type of error rate used for an error analysis.

According to a first aspect of the embodiments described, a method provides for remapping portions of an array of non-volatile memory resident on a die, in which the die is one of a plurality of non-volatile memory dice forming a memory device. The method partitions the array of non-volatile memory into a plurality of subslice elements having a plurality of storage elements for each subslice element, wherein respective subslice elements comprise respective physical portions of non-volatile memory having proximal disturb relationships. The method allocates a first portion of the subslice elements for use as user subslice elements and a second portion for use as spare subslice elements and performs an error analysis of the subslice elements to identify a predetermined number of subslice elements having highest error rates for a memory domain on the die. For the identified predetermined number of subslice elements having the highest error rates, the method determines which of the predetermined number of subslice elements are user subslice elements and which are spare subslice elements and remaps user subslice elements having the highest error rates to spare subslice elements that were not identified as having the highest error rates to remove subslice element or elements having highest error rates from a user space of the non-volatile memory.

In a second aspect of the embodiments described, an apparatus provides for remapping portions of an array of non-volatile memory resident on a die, in which the die is one of a plurality of non-volatile memory dice forming a memory device. A memory device is configured to store a subslice element status map. The apparatus has a processing device, coupled to the array of non-volatile memory and the memory device. The processing device partitions the array of non-volatile memory into a plurality of subslice elements having a plurality of storage elements for each subslice element, wherein respective subslice elements comprise respective physical portions of non-volatile memory having proximal disturb relationships. The processing device allocates a first portion of the subslice elements for use as user subslice elements and a second portion for use as spare subslice elements and performs an error analysis of the subslice elements to identify a predetermined number of subslice elements having highest error rates for a memory domain on the die. The processing device then sets corresponding entries in the subslice element status map to identify the subslice elements having the highest error rates and using the subslice element status map, determines which user subslice elements have the highest error rates and are to be remapped. The processing device remaps user subslice elements having the highest error rates to spare subslice elements that were not identified as having the highest error rates to remove subslice element or elements having the highest error rates from a user space of the non-volatile memory.

In a third aspect of the embodiments described an apparatus provides for remapping portions of a non-volatile memory die, in which the non-volatile memory die is one of a plurality of non-volatile memory dice forming a memory device. The apparatus has an array of non-volatile memory resident on the die and physically arranged in separate slices where at least some slices have subslices on different levels, wherein the array of non-volatile memory is partitioned into a plurality of subslice elements having a plurality of storage elements for each subslice element, wherein respective subslice elements comprise respective physical portions of non-volatile memory having proximal disturb relationships, and wherein the array of non-volatile memory is allocated a first portion of the subslice elements for use as user subslice elements and a second portion for use as spare subslice elements. The apparatus also has a processing device coupled to the array of non-volatile memory to perform an error analysis of the subslice elements to identify a predetermined number of subslice elements having highest error rates for a memory domain on the die. For the identified predetermined number of subslice elements having the highest error rates, the processing device determines which of the predetermined number of subslice elements are user subslice elements and which are spare subslice elements. The processing device remaps user subslice elements having the highest error rates to spare subslice elements that were not identified as having the highest error rates to remove subslice element or elements having highest error rates from a user space of the non-volatile memory.

Advantages may be derived from the practice of the embodiments described. Where traditional techniques for defect management are not proximity disturb aware, the embodiments described herein introduces a model where defects and proximity disturb are co-managed. The described techniques are flexible and capable of managing memory with a wide variety of failure/defectivity models, ranging from uniform random defects to edge of die/wafer defects to endurance related defects. The described techniques have low implementation cost/complexity and is SRAM friendly. The technique is dynamic, reacting to defectivity as it is observed over the lifetime of a drive or device. Many traditional techniques employ defect management strategies that make irreversible remapping. Irreversible techniques have to balance the threshold at which an irreversible action is taken (neither too early or too late, neither approach being ideal) with the cost of consuming a fixed amount of predetermined spare media for a limited pool. The described techniques can handle defects representing as a large cluster of fine-grained physical media (e.g. a whole die), as well as scattered defects spread across media. Hence, it can be used to remap entire large function units, such as multiple dice.

What is claimed is:

1. A method for remapping portions of an array of non-volatile memory resident on a die, in which the die is one of a plurality of non-volatile memory dice forming a memory device, the method comprising:
   partitioning the array of non-volatile memory into a plurality of subslices with each subslice having a plurality of subslice elements, wherein respective subslice elements comprise respective physical portions of the non-volatile memory having proximal disturb relationships;
   allocating, for a memory domain on the die, a first portion of subslice elements of the plurality of subslices for use as user subslice elements and a second portion of the subslice elements of the plurality of subslices for use as spare subslice elements;

performing an error analysis of both the first portion and the second portion of the subslice elements to identify a predetermined number of subslice elements having highest error rates in the first and second portions;

for the identified predetermined number of subslice elements having the highest error rates, determining which of the predetermined number of subslice elements are user subslice elements of the first portion and which are spare subslice elements of the second portion; and remapping user subslice elements having the highest error rates to spare subslice elements that were not identified as having the highest error rates to remove subslice elements having the highest error rates as user subslice elements from a user space of the non-volatile memory.

2. The method of claim 1, wherein the predetermined number of subslice elements having the highest error rates is determined by a number of the spare subslice elements allocated.

3. The method of claim 1, wherein the partitioning the array of non-volatile memory further includes allocating the array of non-volatile memory into an M by N matrix of M subslice rows and N partitions to form M×N subslice elements.

4. The method of claim 3, wherein at least one subslice row of subslice elements is allocated as the spare subslice elements.

5. The method of claim 3, wherein the M by N matrix is a square matrix comprising 16 subslices by 16 partitions to form a 16×16 array of 256 subslice elements.

6. The method of claim 3, wherein the remapping removes the user subslice elements having the highest error rates from a respective partition of the user space and remaps in place a spare subslice element of the respective partition.

7. The method of claim 3, wherein the memory domain is the die and the remapping removes the subslice elements having the highest error rates from the user space on the die and remaps in place spare subslice elements on the die.

8. The method of claim 7, wherein the remapping the user subslice elements further comprises remapping a respective user subslice element to a spare subslice element of a same partition as the respective user subslice element, when available, otherwise remapping the respective user subslice element to another spare subslice element of a different partition on the die.

9. The method of claim 1 wherein the performing the error analysis of the subslice elements further comprises determining a Raw Bit Error Rate (RBER) for respective ones of the subslice elements of the memory domain and the subslice elements having the highest error rates correspond to having highest RBERs.

10. The method of claim 1 further comprising setting a bit in corresponding entries in a subslice element status map to identify the subslice elements having the highest error rates.

11. The method of claim 10, wherein the remapping further comprising:

for each subslice element having the bit set in the corresponding entry in the subslice element status map, entering a location information for that subslice element in a corresponding entry of a subslice substitution data structure, in which the subslice substitution data structure is indexed relative to the spare subslice elements, to remap user subslice elements having the highest error rates to available spare subslice elements.

12. The method of claim 1 further comprising performing the partitioning, the allocating, the performing the error analysis, the determining and the remapping for a memory domain of a second die of the plurality of non-volatile memory dice.

13. An apparatus for remapping portions of an array of non-volatile memory resident on a die, in which the die is one of a plurality of non-volatile memory dice forming a first memory device, the apparatus comprising:

a second memory device configured to store a subslice element status map; and a processing device, coupled to the array of non-volatile memory and the second memory device, configured to:

partition the array of non-volatile memory into a plurality of subslices with each subslice having a plurality of subslice elements, wherein respective subslice elements comprise respective physical portions of the non-volatile memory having proximal disturb relationships;

allocate, for a memory domain on the die, a first portion of subslice elements of the plurality of subslices for use as user subslice elements and a second portion of the subslice elements of the plurality of subslices for use as spare subslice elements;

perform an error analysis of both the first portion and the second portion of the subslice elements to identify a predetermined number of subslice elements having highest error rates in the first and second portions;

set corresponding entries in the subslice element status map to identify the subslice elements having the highest error rates;

using the subslice element status map, determine which user subslice elements of the first portion have the highest error rates and are to be remapped; and remap user subslice elements having the highest error rates to spare subslice elements of the second portion that were not identified as having the highest error rates to remove subslice elements having the highest error rates as user subslice elements from a user space of the non-volatile memory.

14. The apparatus of claim 13, wherein the second memory device further includes a subslice substitution data structure and the processing device is further configured to remap each user subslice element having a bit set in the corresponding entry in the subslice element status map, by entering a location information for that user subslice element in a corresponding entry of the subslice substitution data structure, in which the subslice substitution data structure is indexed relative to the spare subslice elements, to remap user subslice elements having the highest error rates to available spare subslice elements.

15. The apparatus of claim 14, wherein the array of non-volatile memory is physically arranged in separate slices and at least some slices have subslices on different levels.

16. The apparatus of claim 15, wherein the processing device is further configured to allocate the array of non-volatile memory into a M by N matrix of M subslice rows and N partitions to form M×N subslice elements, wherein respective subslice elements of a row of M subslice rows comprise respective physical portions of the non-volatile memory resident on a same slice and on a same level of the die.

17. The apparatus of claim 16, wherein the memory domain is the die or a portion of the die.

18. The apparatus of claim 16, wherein the processing device is further configured to logically rotate orientation of storage elements associated with a user subslice element being remapped when the remap is to a spare subslice element physically located on a different level from the user subslice element being remapped.

19. The apparatus of claim 13, wherein the processing device is configured to perform the error analysis by determining a Raw Bit Error Rate (RBER) for respective ones of the subslice elements and the subslice elements having the highest error rates correspond to having highest RBERs.

20. An apparatus for remapping portions of a non-volatile memory die, in which the non-volatile memory die is one of a plurality of non-volatile memory dice forming a memory device, the apparatus comprising:
an array of non-volatile memory resident on the die and physically arranged in separate slices where at least some slices have subslices on different levels, wherein the array of non-volatile memory is partitioned into a plurality of subslices with each subslice having a plurality of subslice elements, wherein respective subslice elements comprise respective physical portions of the non-volatile memory having proximal disturb relationships, and wherein the array of non-volatile memory is allocated, for a memory domain on the die, a first portion of subslice elements of the plurality of subslices for use as user subslice elements and a second portion of the subslice elements of the plurality of subslices for use as spare subslice elements; and
a processing device coupled to the array of non-volatile memory and configured to:
perform an error analysis of both the first portion and the second portion of the subslice elements to identify a predetermined number of subslice elements having highest error rates in the first and second portions;
for the identified predetermined number of subslice elements having the highest error rates, determine which of the predetermined number of subslice elements are user subslice elements of the first portion and which are spare subslice elements of the second portion; and
remap user subslice elements having the highest error rates to spare subslice elements that were not identified as having the highest error rates to remove subslice elements having the highest error rates as user subslice elements from a user space of the non-volatile memory.

21. The apparatus of claim 20 further comprising another memory device to store a subslice element status map, wherein setting a bit in corresponding entries in the subslice element status map identifies the subslice elements having the highest error rates.

22. The apparatus of claim 21, wherein the other memory device further includes a subslice substitution data structure and the processing device is further configured to remap each user subslice element having the bit set in the corresponding entry in the subslice element status map, by entering a location information for that user subslice element in a corresponding entry of the subslice substitution data structure, in which the subslice substitution data structure is indexed relative to the spare subslice elements, to remap user subslice elements having the highest error rates to available spare subslice elements.

23. The apparatus of claim 22, wherein the memory domain is the die or a portion of the die.

24. The apparatus of claim 22, wherein the processing device is configured to perform the error analysis by determining a Raw Bit Error Rate (RBER) for respective ones of the subslice elements and the subslice elements having the highest error rates correspond to having highest RBERs.

* * * * *